(12) United States Patent
Otsuka et al.

(10) Patent No.: US 8,181,356 B2
(45) Date of Patent: May 22, 2012

(54) SUBSTRATE PROCESSING METHOD

(75) Inventors: Takahisa Otsuka, Koshi (JP); Tsuyoshi Shibata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 11 days.

(21) Appl. No.: 12/973,111

(22) Filed: Dec. 20, 2010

(65) Prior Publication Data

US 2011/0086514 A1    Apr. 14, 2011

Related U.S. Application Data

(62) Division of application No. 11/757,151, filed on Jun. 1, 2007, now Pat. No. 7,877,895.

(30) Foreign Application Priority Data

Jun. 26, 2006 (JP) ................................ 2006-174695

(51) Int. Cl.
F26B 11/00 (2006.01)

(52) U.S. Cl. ................ 34/381; 34/413; 34/427; 34/497; 118/720; 118/725; 427/240; 427/414

(58) Field of Classification Search ................ 34/78, 90, 34/380, 381, 413, 427, 497, 524; 118/720, 118/725; 427/240, 414
See application file for complete search history.

(56) References Cited

U.S. PATENT DOCUMENTS

| | | |
|---|---|---|
| 2,848,819 A | 8/1958 | Schoenfeld, Jr. |
| 3,151,950 A | 10/1964 | Newman et al. |
| 3,491,457 A | 1/1970 | Hankin et al. |
| 3,529,360 A | 9/1970 | Moustafellos et al. |
| 3,561,130 A | 2/1971 | Galitz |
| 3,609,876 A | 10/1971 | Bachrach et al. |
| 3,634,947 A | 1/1972 | Furgal |
| 3,650,042 A | 3/1972 | Boerger et al. |
| 3,703,772 A | 11/1972 | McHugh et al. |
| 3,710,450 A | 1/1973 | Figiel |
| 3,740,859 A | 6/1973 | Patton et al. |
| 3,747,223 A | 7/1973 | Faulhaber |
| 3,851,402 A | 12/1974 | Turnbull et al. |
| 3,931,684 A | 1/1976 | Turnbull et al. |
| 4,143,468 A | 3/1979 | Novotny et al. |
| 4,150,494 A | 4/1979 | Rothchild |
| 4,194,297 A | 3/1980 | Pfahl, Jr. |

(Continued)

FOREIGN PATENT DOCUMENTS

EP    845802    6/1998

(Continued)

OTHER PUBLICATIONS

Office Action issued Oct. 29, 2010, in Korean Patent Application No. 10-2007-61944 (with Partial English translation).

*Primary Examiner* — Stephen M. Gravini

(74) *Attorney, Agent, or Firm* — Oblon, Spivak, McClelland, Maier & Neustadt, L.L.P.

(57) ABSTRACT

A substrate processing method is arranged to perform a heat process on a substrate with a coating film formed thereon to bake and cure the coating film. At first, the substrate, with the coating film formed thereon, is held at a preparatory temperature lower than a lower limit of temperature for baking and curing the coating film, to adjust distribution of a predetermined component in the coating film. Then, the substrate, with distribution of the predetermined component thus adjusted, is subjected to a heat process at a temperature not lower than the lower limit of temperature.

6 Claims, 11 Drawing Sheets

U.S. PATENT DOCUMENTS

| | | | |
|---|---|---|---|
| 4,438,685 A | 3/1984 | Haas et al. |
| 4,455,762 A | 6/1984 | Saeman |
| 4,458,427 A | 7/1984 | Akeret |
| 4,458,428 A | 7/1984 | Saeman |
| 4,492,041 A | 1/1985 | Mansour |
| 4,507,078 A | 3/1985 | Tam et al. |
| 4,532,719 A | 8/1985 | Davies et al. |
| 4,545,136 A | 10/1985 | Izu et al. |
| 4,546,553 A | 10/1985 | Best |
| 4,563,617 A | 1/1986 | Davidson |
| 4,567,675 A | 2/1986 | Rennie |
| 4,768,291 A | 9/1988 | Palmer |
| 4,785,552 A | 11/1988 | Best |
| 4,796,562 A | 1/1989 | Brors et al. |
| 4,811,493 A | 3/1989 | Burgio, Jr. |
| 4,841,645 A | 6/1989 | Bettcher et al. |
| 4,872,270 A | 10/1989 | Fronheiser et al. |
| 4,967,486 A | 11/1990 | Doelling |
| 5,001,845 A | 3/1991 | Norz et al. |
| 5,010,659 A | 4/1991 | Treleven |
| 5,048,198 A | 9/1991 | Burgio, Jr. |
| 5,054,210 A | 10/1991 | Schumacher et al. |
| 5,079,854 A | 1/1992 | Hammond et al. |
| 5,081,773 A | 1/1992 | Brusati et al. |
| 5,090,134 A | 2/1992 | Russemeyer et al. |
| 5,119,570 A | 6/1992 | Russemeyer et al. |
| 5,167,078 A | 12/1992 | Bolde et al. |
| 5,174,045 A | 12/1992 | Thompson et al. |
| 5,210,959 A | 5/1993 | Brestovansky et al. |
| 5,226,241 A | 7/1993 | Goodwin |
| 5,228,206 A | 7/1993 | Grant et al. |
| 5,279,045 A | 1/1994 | Odashima et al. |
| 5,291,668 A | 3/1994 | Becker et al. |
| 5,321,896 A | 6/1994 | Brownewell et al. |
| 5,325,601 A | 7/1994 | Brownewell et al. |
| 5,357,687 A | 10/1994 | Swain |
| 5,369,891 A | 12/1994 | Kamikawa |
| 5,371,950 A | 12/1994 | Schumacher |
| 5,394,622 A | 3/1995 | Evans et al. |
| 5,418,136 A | 5/1995 | Miller et al. |
| 5,433,020 A | 7/1995 | Leech, Jr. |
| 5,459,944 A | 10/1995 | Tatsutani et al. |
| 5,468,606 A | 11/1995 | Bogart et al. |
| 5,482,830 A | 1/1996 | Bogart et al. |
| 5,494,829 A | 2/1996 | Sandstrom et al. |
| 5,526,578 A | 6/1996 | Iyer |
| 5,541,057 A | 7/1996 | Bogart et al. |
| 5,548,907 A | 8/1996 | Gourdine |
| 5,550,063 A | 8/1996 | Bogart |
| 5,552,272 A | 9/1996 | Bogart |
| 5,581,905 A | 12/1996 | Huelsman et al. |
| 5,597,460 A | 1/1997 | Reynolds |
| 5,620,560 A | 4/1997 | Akimoto et al. |
| 5,621,983 A | 4/1997 | Lundemann et al. |
| 5,629,214 A | 5/1997 | Crosby |
| 5,631,171 A | 5/1997 | Sandstrom et al. |
| 5,639,671 A | 6/1997 | Bogart et al. |
| 5,653,045 A | 8/1997 | Ferrell |
| 5,675,911 A | 10/1997 | Moser |
| 5,685,086 A | 11/1997 | Ferrell |
| 5,694,701 A | 12/1997 | Huelsman et al. |
| 5,713,138 A | 2/1998 | Rudd |
| 5,737,851 A | 4/1998 | Novak et al. |
| 5,813,133 A | 9/1998 | Munter et al. |
| 5,869,272 A | 2/1999 | Bogart et al. |
| 5,881,476 A | 3/1999 | Strobush et al. |
| 5,901,462 A | 5/1999 | Rudd |
| 5,937,536 A | 8/1999 | Kieselbach et al. |
| 5,953,828 A | 9/1999 | Hillman |
| 5,953,833 A | 9/1999 | Rudd |
| 5,955,377 A | 9/1999 | Maul et al. |
| 5,956,605 A | 9/1999 | Akram et al. |
| 5,960,555 A | 10/1999 | Deaton et al. |
| 5,974,682 A | 11/1999 | Akimoto |
| 5,974,687 A | 11/1999 | Gante et al. |
| 5,974,689 A | 11/1999 | Ferrell et al. |
| 6,035,548 A | 3/2000 | Rae |
| 6,058,625 A | 5/2000 | Kieselbach et al. |
| 6,088,931 A | 7/2000 | Aylor et al. |
| 6,108,935 A | 8/2000 | Dodson |
| 6,119,366 A | 9/2000 | Ferrell et al. |
| 6,122,837 A | 9/2000 | Olesen et al. |
| 6,134,808 A | 10/2000 | Yapel et al. |
| 6,151,794 A | 11/2000 | Wu |
| 6,158,146 A | 12/2000 | Kieselbach et al. |
| 6,161,300 A | 12/2000 | Kim |
| 6,161,304 A | 12/2000 | Iaccino et al. |
| 6,212,789 B1 | 4/2001 | Kato et al. |
| 6,217,721 B1 | 4/2001 | Xu et al. |
| 6,243,969 B1 | 6/2001 | Yeazell |
| 6,256,903 B1 | 7/2001 | Rudd |
| 6,256,904 B1 | 7/2001 | Kolb et al. |
| 6,279,249 B1 | 8/2001 | Dao et al. |
| 6,286,231 B1 | 9/2001 | Bergman et al. |
| 6,313,448 B1 | 11/2001 | Johnson |
| 6,357,142 B1 | 3/2002 | Bergman et al. |
| 6,374,512 B1 | 4/2002 | Guo et al. |
| 6,381,870 B1 | 5/2002 | Kohlman et al. |
| 6,381,873 B1 | 5/2002 | Peremychtchev et al. |
| 6,397,488 B1 | 6/2002 | Brinkly |
| 6,412,190 B1 | 7/2002 | Smith |
| 6,413,871 B2 | 7/2002 | M'Saad et al. |
| 6,430,841 B1 | 8/2002 | Borkowski et al. |
| 6,438,867 B1 | 8/2002 | Teich et al. |
| 6,446,355 B1 | 9/2002 | Jones et al. |
| 6,477,786 B1 | 11/2002 | Jones et al. |
| 6,509,070 B1 | 1/2003 | Voevodin et al. |
| 6,519,869 B2 | 2/2003 | Peng |
| 6,528,894 B1 | 3/2003 | Akram et al. |
| 6,543,156 B2 | 4/2003 | Bergman et al. |
| 6,553,689 B2 | 4/2003 | Jain et al. |
| 6,564,472 B1 | 5/2003 | Dodson |
| 6,564,474 B2 | 5/2003 | Nagashima |
| 6,606,802 B2 | 8/2003 | Sandhu et al. |
| 6,615,510 B2 | 9/2003 | Jones et al. |
| 6,647,642 B2 | 11/2003 | Kamikawa et al. |
| 6,651,357 B2 | 11/2003 | Bria et al. |
| 6,655,040 B2 | 12/2003 | Whipple |
| 6,658,760 B2 | 12/2003 | Kohlman et al. |
| 6,660,680 B1 | 12/2003 | Hampden-Smith et al. |
| 6,665,952 B2 | 12/2003 | Nagashima |
| 6,681,497 B2 | 1/2004 | Bria et al. |
| RE38,412 E | 2/2004 | Munter et al. |
| 6,701,637 B2 | 3/2004 | Lindsay et al. |
| 6,729,041 B2 | 5/2004 | Shindo et al. |
| 6,742,279 B2 | 6/2004 | Lubomirsky et al. |
| 6,745,494 B2 | 6/2004 | Bergman et al. |
| 6,753,108 B1 | 6/2004 | Hampden-Smith et al. |
| 6,763,608 B2 | 7/2004 | Dao et al. |
| 6,796,054 B2 | 9/2004 | Minami et al. |
| 6,826,849 B1 | 12/2004 | Millonzi |
| 6,830,631 B2 | 12/2004 | Nenyei et al. |
| 6,848,198 B2 | 2/2005 | Yamaguchi |
| 6,849,308 B1 | 2/2005 | Speakman et al. |
| 6,868,623 B2 | 3/2005 | Bjornberg |
| 6,871,418 B2 | 3/2005 | Raychaudhuri et al. |
| 6,877,247 B1 | 4/2005 | DeMoore |
| 6,884,298 B2 | 4/2005 | Kitano et al. |
| 6,889,447 B2 | 5/2005 | Lee et al. |
| 6,911,412 B2 | 6/2005 | Hampden-Smith et al. |
| 6,915,592 B2 | 7/2005 | Guenther |
| 6,922,910 B2 | 8/2005 | Tsuji et al. |
| 6,952,889 B2 | 10/2005 | Yoo |
| 6,959,502 B2 | 11/2005 | Nakamura et al. |
| 6,967,183 B2 | 11/2005 | Hampden-Smith et al. |
| 6,972,249 B2 | 12/2005 | Akram et al. |
| 6,986,214 B2 | 1/2006 | Minami et al. |
| 6,991,754 B2 | 1/2006 | Hampden-Smith et al. |
| 7,020,981 B2 | 4/2006 | Shero et al. |
| 7,024,798 B2 | 4/2006 | Minami et al. |
| 7,032,324 B2 | 4/2006 | Kolb et al. |
| 7,055,263 B2 | 6/2006 | Wu et al. |
| 7,066,976 B2 | 6/2006 | Hampden-Smith et al. |
| 7,086,175 B2 | 8/2006 | Sasaki et al. |
| 7,087,341 B2 | 8/2006 | Hampden-Smith et al. |
| 7,100,302 B2 | 9/2006 | Kolb et al. |
| 7,103,990 B2 | 9/2006 | Ohmi et al. |

| Patent No. | Date | Inventor |
|---|---|---|
| 7,138,159 B2 | 11/2006 | Hampden-Smith et al. |
| 7,138,354 B2 | 11/2006 | Hampden-Smith et al. |
| 7,141,528 B2 | 11/2006 | Hampden-Smith et al. |
| 7,143,528 B2 | 12/2006 | Kolb |
| 7,146,744 B2 | 12/2006 | Kobayashi |
| 7,207,123 B2 | 4/2007 | Tanahashi et al. |
| 7,211,345 B2 | 5/2007 | Hampden-Smith et al. |
| 7,213,347 B2 | 5/2007 | Long |
| 7,225,560 B2 | 6/2007 | Govek et al. |
| 7,225,561 B2 | 6/2007 | Louw et al. |
| 7,255,954 B2 | 8/2007 | Hampden-Smith et al. |
| 7,303,387 B2 | 12/2007 | Hutchinson et al. |
| 7,304,715 B2 | 12/2007 | Cadee et al. |
| 7,343,698 B2 | 3/2008 | Sugimoto et al. |
| 7,353,623 B2 | 4/2008 | Asuke |
| 7,363,729 B2 | 4/2008 | Tanaka et al. |
| 7,367,138 B2 | 5/2008 | Sogard |
| 7,371,698 B2 | 5/2008 | Moriya et al. |
| 7,409,777 B2 | 8/2008 | Shiveley |
| 7,433,636 B2 | 10/2008 | Teschendorf et al. |
| 7,449,718 B2 | 11/2008 | Nishi et al. |
| 7,464,486 B2 | 12/2008 | Kubodera et al. |
| 7,479,456 B2 | 1/2009 | Buchberger et al. |
| 7,484,315 B2 | 2/2009 | Suzuki et al. |
| 7,501,306 B2 | 3/2009 | Nishi et al. |
| 7,526,878 B2 | 5/2009 | Sonobe et al. |
| 7,545,336 B2 | 6/2009 | Naito |
| 7,550,117 B2 | 6/2009 | Alward et al. |
| 7,572,416 B2 | 8/2009 | Alward et al. |
| 7,578,668 B2 | 8/2009 | Hutchinson et al. |
| 7,625,198 B2 | 12/2009 | Lipson et al. |
| 7,644,512 B1 | 1/2010 | Liu et al. |
| 7,654,010 B2 | 2/2010 | Moriya et al. |
| 7,665,227 B2 | 2/2010 | Wright et al. |
| 7,681,521 B2 | 3/2010 | Nishibayashi |
| 7,685,738 B2 | 3/2010 | Jones |
| 7,717,697 B2 | 5/2010 | Hutchinson et al. |
| 7,722,687 B2 | 5/2010 | Hampden-Smith et al. |
| 7,727,809 B2 | 6/2010 | Ito et al. |
| 7,785,544 B2 | 8/2010 | Alward et al. |
| 2001/0005944 A1 | 7/2001 | Dao et al. |
| 2001/0007174 A1 | 7/2001 | Hashizume et al. |
| 2001/0033900 A1 | 10/2001 | M'Saad et al. |
| 2002/0004994 A1 | 1/2002 | Rudd |
| 2002/0004995 A1 | 1/2002 | France et al. |
| 2002/0008034 A1 | 1/2002 | Chen et al. |
| 2002/0026729 A1 | 3/2002 | Bergman et al. |
| 2002/0056206 A1 | 5/2002 | Pace et al. |
| 2002/0073576 A1 | 6/2002 | Kamikawa et al. |
| 2002/0092198 A1 | 7/2002 | Bria et al. |
| 2002/0095816 A1 | 7/2002 | Bergman et al. |
| 2002/0095818 A1 | 7/2002 | Jain et al. |
| 2002/0096508 A1 | 7/2002 | Weaver et al. |
| 2002/0100185 A1 | 8/2002 | Sitz et al. |
| 2002/0107140 A1 | 8/2002 | Hampden-Smith et al. |
| 2002/0112365 A1 | 8/2002 | Kohlman et al. |
| 2002/0132052 A1 | 9/2002 | Kumar et al. |
| 2002/0152630 A1 | 10/2002 | Lindsay et al. |
| 2002/0170202 A1 | 11/2002 | Peng |
| 2003/0000102 A1 | 1/2003 | Jones et al. |
| 2003/0013606 A1 | 1/2003 | Hampden-Smith et al. |
| 2003/0049517 A1 | 3/2003 | Hampden-Smith et al. |
| 2003/0054218 A1 | 3/2003 | Hampden-Smith et al. |
| 2003/0064265 A1 | 4/2003 | Hampden-Smith et al. |
| 2003/0088995 A1 | 5/2003 | Bergman et al. |
| 2003/0101613 A1 | 6/2003 | Sandhu et al. |
| 2003/0118884 A1 | 6/2003 | Hampden-Smith et al. |
| 2003/0126758 A1 | 7/2003 | Whipple |
| 2003/0130114 A1 | 7/2003 | Hampden-Smith et al. |
| 2003/0131494 A1 | 7/2003 | Lubomirsky et al. |
| 2003/0137062 A1 | 7/2003 | Akram et al. |
| 2003/0144134 A1 | 7/2003 | Hampden-Smith et al. |
| 2003/0172542 A1 | 9/2003 | Minami et al. |
| 2003/0181321 A1 | 9/2003 | Hampden-Smith et al. |
| 2003/0198849 A1 | 10/2003 | Hampden-Smith et al. |
| 2003/0230003 A1 | 12/2003 | Miller et al. |
| 2003/0233764 A1 | 12/2003 | Lee et al. |
| 2003/0233768 A1 | 12/2003 | Kaeppeler |
| 2004/0025370 A1 | 2/2004 | Guenther |
| 2004/0031693 A1 | 2/2004 | Chen et al. |
| 2004/0045184 A1 | 3/2004 | Takeshita et al. |
| 2004/0045187 A1 | 3/2004 | Curry et al. |
| 2004/0047993 A1 | 3/2004 | Kumar et al. |
| 2004/0055177 A1 | 3/2004 | Tsuji et al. |
| 2004/0083621 A1 | 5/2004 | Yoo |
| 2004/0118013 A1 | 6/2004 | Kohlman et al. |
| 2004/0128856 A1 | 7/2004 | Bjornberg |
| 2004/0159005 A1 | 8/2004 | Olander |
| 2004/0171480 A1 | 9/2004 | Hampden-Smith et al. |
| 2004/0173948 A1 | 9/2004 | Pandelisev |
| 2004/0187344 A1 | 9/2004 | Yamaguchi |
| 2004/0194340 A1 | 10/2004 | Kobayashi |
| 2004/0216324 A1 | 11/2004 | Nakamura et al. |
| 2004/0216325 A1 | 11/2004 | Minami et al. |
| 2004/0221475 A1 | 11/2004 | Theriault |
| 2004/0231185 A1 | 11/2004 | Kolb |
| 2004/0231186 A1 | 11/2004 | Kolb et al. |
| 2004/0237331 A1 | 12/2004 | Sarfaty et al. |
| 2005/0042151 A1 | 2/2005 | Alward et al. |
| 2005/0056842 A1 | 3/2005 | Nishi et al. |
| 2005/0076532 A1 | 4/2005 | Ward et al. |
| 2005/0086822 A1 | 4/2005 | Frisner et al. |
| 2005/0086825 A1 | 4/2005 | Sasaki et al. |
| 2005/0108892 A1 | 5/2005 | Wu et al. |
| 2005/0126030 A1 | 6/2005 | Ohmi et al. |
| 2005/0141928 A1 | 6/2005 | Teschendorf et al. |
| 2005/0160619 A1 | 7/2005 | Minami et al. |
| 2005/0183283 A1 | 8/2005 | Evanyk et al. |
| 2005/0229427 A1 | 10/2005 | Sugimoto et al. |
| 2005/0241176 A1 | 11/2005 | Shero et al. |
| 2005/0241177 A1 | 11/2005 | Kolb et al. |
| 2005/0246918 A1 | 11/2005 | Tanahashi et al. |
| 2005/0283993 A1 | 12/2005 | Wu et al. |
| 2006/0005420 A1 | 1/2006 | Deguchi et al. |
| 2006/0032072 A1 | 2/2006 | Yamaga et al. |
| 2006/0032079 A1 | 2/2006 | Zhang et al. |
| 2006/0033892 A1 | 2/2006 | Cadee et al. |
| 2006/0033898 A1 | 2/2006 | Cadee et al. |
| 2006/0043065 A1 | 3/2006 | Buchberger et al. |
| 2006/0051451 A1 | 3/2006 | Hutchinson et al. |
| 2006/0059705 A1 | 3/2006 | Wang et al. |
| 2006/0137213 A1 | 6/2006 | Asuke |
| 2006/0156978 A1 | 7/2006 | Lipson et al. |
| 2006/0160250 A1 | 7/2006 | Bonassar et al. |
| 2006/0168839 A1 | 8/2006 | Lee et al. |
| 2006/0174508 A1 | 8/2006 | Govek et al. |
| 2006/0179680 A1 | 8/2006 | Miller et al. |
| 2006/0191160 A1 | 8/2006 | Miller et al. |
| 2006/0201017 A1 | 9/2006 | Ellis et al. |
| 2006/0201018 A1 | 9/2006 | McKay et al. |
| 2006/0213077 A1 | 9/2006 | Tanaka et al. |
| 2006/0236559 A1 | 10/2006 | Mori |
| 2006/0247122 A1 | 11/2006 | Hampden-Smith et al. |
| 2006/0267853 A1 | 11/2006 | Naito |
| 2006/0270082 A1 | 11/2006 | Moriya et al. |
| 2006/0272174 A1 | 12/2006 | Hartig |
| 2007/0015302 A1 | 1/2007 | Nishi et al. |
| 2007/0068035 A1 | 3/2007 | Theriault |
| 2007/0079525 A1 | 4/2007 | Sogard |
| 2007/0107254 A1 | 5/2007 | Kolb |
| 2007/0108668 A1 | 5/2007 | Hutchinson et al. |
| 2007/0169373 A1 | 7/2007 | Aoki et al. |
| 2007/0175062 A1 | 8/2007 | Toshima et al. |
| 2007/0183184 A1 | 8/2007 | Nakamura et al. |
| 2007/0193056 A1 | 8/2007 | Switalski |
| 2007/0193062 A1 | 8/2007 | Moriya et al. |
| 2007/0199204 A1 | 8/2007 | Knight et al. |
| 2007/0209226 A1 | 9/2007 | Coon |
| 2007/0227034 A1 | 10/2007 | Ogawa et al. |
| 2007/0245591 A1 | 10/2007 | Gens et al. |
| 2007/0271808 A9 | 11/2007 | Wang et al. |
| 2007/0278420 A1 | 12/2007 | Molhave |
| 2007/0295973 A1 | 12/2007 | Jinbo et al. |
| 2007/0298188 A1 | 12/2007 | Otsuka et al. |
| 2008/0016714 A1 | 1/2008 | Kaneyama et al. |
| 2008/0090341 A1 | 4/2008 | Tanaka et al. |
| 2008/0104861 A1 | 5/2008 | Yahiro |
| 2008/0112865 A1 | 5/2008 | Alward et al. |

| | | | | | | |
|---|---|---|---|---|---|---|
| 2008/0113257 | A1 | 5/2008 | Hampden-Smith et al. | JP | 61052653 | 3/1986 |
| 2008/0138455 | A1 | 6/2008 | Hutchinson et al. | JP | 61135790 | 6/1986 |
| 2008/0141556 | A1 | 6/2008 | Sorabji et al. | JP | 63014125 | 1/1988 |
| 2008/0153039 | A1 | 6/2008 | Akimoto | JP | 02139990 | 5/1990 |
| 2008/0171650 | A1 | 7/2008 | Alward et al. | JP | 03006367 | 1/1991 |
| 2008/0172903 | A1 | 7/2008 | Shimoda et al. | JP | 04307446 | 10/1992 |
| 2008/0184584 | A1 | 8/2008 | Sogard | JP | 05054455 | 3/1993 |
| 2008/0201980 | A1 | 8/2008 | Bullinger et al. | JP | 05257145 | 10/1993 |
| 2008/0307668 | A1 | 12/2008 | Watterodt et al. | JP | 06117993 | 4/1994 |
| 2009/0001469 | A1 | 1/2009 | Yoshida et al. | JP | 06151678 | 5/1994 |
| 2009/0050941 | A1 | 2/2009 | Yamazaki et al. | JP | 07314917 | 12/1995 |
| 2009/0077825 | A1 | 3/2009 | Toofan et al. | JP | 08112925 | 5/1996 |
| 2009/0078970 | A1 | 3/2009 | Yamazaki et al. | JP | 9-15572 | 1/1997 |
| 2009/0079000 | A1 | 3/2009 | Yamazaki et al. | JP | 10280182 | 10/1998 |
| 2009/0098674 | A1 | 4/2009 | Yamazaki et al. | JP | 11086366 | 3/1999 |
| 2009/0098710 | A1 | 4/2009 | Yamazaki | JP | 11169774 | 6/1999 |
| 2009/0114926 | A1 | 5/2009 | Yamazaki | JP | 2000019146 | 1/2000 |
| 2009/0115028 | A1 | 5/2009 | Shimomura et al. | JP | 2000169157 | 6/2000 |
| 2009/0139781 | A1 | 6/2009 | Straubel | JP | 2000183252 | 6/2000 |
| 2009/0181552 | A1 | 7/2009 | Shimomura et al. | JP | 2000277816 | 10/2000 |
| 2009/0199425 | A1 | 8/2009 | Taylor | JP | 2000353650 | 12/2000 |
| 2009/0212285 | A1 | 8/2009 | Nishi et al. | JP | 2001015502 | 1/2001 |
| 2009/0223079 | A1 | 9/2009 | Myong | JP | 2001153564 | 6/2001 |
| 2009/0274602 | A1 | 11/2009 | Alward et al. | JP | 2003-258076 | 9/2003 |
| 2009/0289340 | A1 | 11/2009 | Yamazaki et al. | JP | 2004333591 | 11/2004 |
| 2009/0300939 | A1 | 12/2009 | Kennedy et al. | JP | 2006255679 | 9/2006 |
| 2010/0072611 | A1 | 3/2010 | Oikawa et al. | JP | 2007035935 | 2/2007 |
| | | | | JP | 2007123541 | 5/2007 |
| FOREIGN PATENT DOCUMENTS | | | | JP | 2008098535 | 4/2008 |
| JP | | 56121040 | 9/1981 | JP | 2009139609 | 6/2009 |
| JP | | 58009052 | 1/1983 | JP | 2010029773 | 2/2010 |
| JP | | 59071331 | 4/1984 | WO | WO 9939908 | 8/1999 |
| JP | | 59077469 | 5/1984 | WO | WO 02070957 | 9/2002 | ium used
SUBSTRATE PROCESSING METHOD

CROSS REFERENCE TO RELATED APPLICATIONS

This application is a divisional of pending U.S. application Ser. No. 11/757,151, filed on Jun. 1, 2007, which claims priority to Japanese Patent Application No. 2006-174695, filed on Jun. 26, 2006, the contents of each of which are hereby incorporated by reference.

BACKGROUND OF THE INVENTION

1. Field of the Invention

The present invention relates to a substrate processing method and substrate processing apparatus for processing a substrate with a coating film formed thereon, which is used for e.g., manufacturing semiconductor devices.

2. Description of the Related Art

In a photolithography step for semiconductor devices, a resist is applied onto a semiconductor wafer (which will be simply referred to as "wafer" hereinafter) to form a resist film. Then, the resist film is subjected to a light exposure process in accordance with a predetermined circuit pattern. Then, the light-exposed pattern thus formed is subjected to a developing process to form a circuit pattern on the resist film.

In a photolithography step of this type, a resist coating/developing system is used for performing a series of processes, such as resist coating, development after light exposure, and heat processes accompanying them. There is a system of this kind that includes a plurality of processing units for performing respective processes, and a transfer unit for sequentially transferring a plurality of wafers to and from the processing units in accordance with the order of processes (Jpn. Pat. Appln. KOKAI Publication No. 2003-258076).

Further, in a photolithography step, a coating liquid of, e.g., resist or BARC (anti-reflective coating) is applied, and is then baked and cured (hardened by baking) by a heat process, such as a pre-baking process. This heat process may be performed by a heat processing unit of the type that includes a heating plate configured to perform a baking process on a wafer placed thereon, while being heated by a heater (U.S. Pat. No. 5,620,560 and Jpn. Pat. Appln. KOKAI Publication No. 9-15572).

Where a pre-baking process is performed by such a heat processing unit in the system described above, a transfer unit is used for sequentially transferring a plurality of wafers to and from a plurality of processing units in accordance with the order of processes. In this case, the wafers suffer differences in, e.g., waiting time for the respective processing units, depending on the busyness of the transfer unit, so the wafers have different time lengths from the time each wafer is coated with a coating liquid to the time it is loaded into the heat processing unit. Such differences in transfer time length may bring about fluctuations in the distribution of a specific component after the coating liquid is baked and cured, although it depends on the coating liquid. It follows that the line width (CD (Critical Dimension)) may become unequal among the wafers.

Previously, fluctuates of this kind did not cause serious problems, but, in recent years, even slight fluctuates of this kind are problematic, because circuit patterns used for semiconductor devices have become drastically smaller. Accordingly, it is required to suppress the fluctuations described above in pre-baking processes.

BRIEF SUMMARY OF THE INVENTION

An object of the present invention is to provide a substrate processing method and apparatus that can suppress the fluctuations described above among substrates after a coating film is baked and cured. Another object of the present invention is to provide a computer readable storage medium used for executing the method described above.

According to a first aspect of the present invention, there is provided a substrate processing method for performing a heat process on a substrate with a coating film formed thereon to bake and cure the coating film, the method comprising: holding the substrate, with the coating film formed thereon, at a preparatory temperature lower than a lower limit of temperature for baking and curing the coating film, to adjust distribution of a predetermined component in the coating film; and subjecting the substrate, with distribution of the predetermined component thus adjusted, to a heat process at a temperature not lower than the lower limit of temperature.

In the first aspect, said holding the substrate at the preparatory temperature may be arranged to localize the predetermined component. The temperature not lower than the lower limit of temperature is preferably a temperature for hardening or cross-linking the coating film. The preparatory temperature is preferably a temperature lower than a temperature for hardening or cross-linking the coating film, and is preferably within a range of 70 to 100° C.

According to a second aspect of the present invention, there is provided a substrate processing method for performing a heat process on a plurality of substrates each with a coating film formed thereon to bake and cure the coating film, while sequentially transferring the substrates, the method comprising: distinguishing the substrates from each other in accordance with a first state and a second state where an elapsed time length since formation of the coating film is shorter and not shorter, respectively, than a predetermined time length; holding each substrate having the first state at a preparatory temperature lower than a lower limit of temperature for baking and curing the coating film, to adjust distribution of a predetermined component in the coating film, and then subjecting the substrate having the first state to a heat process at a temperature not lower than the lower limit of temperature; and subjecting each substrate having the second state to a heat process at a temperature not lower than the lower limit of temperature, without holding the substrate having the second state at a temperature lower than the lower limit of temperature.

In the first and second aspects, the coating film may be an anti-reflective coating or resist film.

According to a third aspect of the present invention, there is provided a substrate processing apparatus for performing a heat process on a substrate with a coating film formed thereon to bake and cure the coating film, the apparatus comprising: a substrate supporting section configured to hold the substrate, with the coating film formed thereon, at a preparatory temperature lower than a lower limit of temperature for baking and curing the coating film; a heat processing section configured to subject the substrate, with the coating film formed thereon, to a heat process at a temperature not lower than the lower limit of temperature; and a transfer mechanism configured to transfer the substrate, with the coating film formed thereon, from the substrate supporting section to the heat processing section, wherein the apparatus processes the substrate by the substrate supporting section to adjust distribution of a predetermined component in the coating film, and then transfers the substrate to the heat processing section and subjects the substrate to the heat process.

In the third aspect, the substrate supporting section may be arranged to localize the predetermined component in the coating film.

According to a fourth aspect of the present invention, there is provided a substrate processing apparatus for performing a heat process on a substrate with a coating film formed thereon to bake and cure the coating film, the apparatus comprising: a substrate supporting section configured to hold the substrate, with the coating film formed thereon, at a preparatory temperature lower than a lower limit of temperature for baking and curing the coating film; a heat processing section configured to subject the substrate, with the coating film formed thereon, to a heat process at a temperature not lower than the lower limit of temperature; a transfer mechanism configured to transfer the substrate, with the coating film formed thereon, from the substrate supporting section to the heat processing section; and a control section configured to control at least one of holding temperature and holding time in the substrate supporting section to adjust distribution of a predetermined component in the coating film, wherein the apparatus processes the substrate by the substrate supporting section under control of the control section to adjust distribution of the predetermined component in the coating film, and then transfers the substrate to the heat processing section and subjects the substrate to the heat process.

In the fourth aspect, the control section may be configured to control at least one of holding temperature and holding time in the substrate supporting section to localize the predetermined component in the coating film in the substrate supporting section.

According to a fifth aspect of the present invention, there is provided a substrate processing apparatus for performing a heat process on a plurality of substrates each with a coating film formed thereon to bake and cure the coating film, while sequentially transferring the substrates, the apparatus comprising: a substrate supporting section configured to hold each substrate, with the coating film formed thereon, at a preparatory temperature lower than a lower limit of temperature for baking and curing the coating film, to adjust distribution of a predetermined component in the coating film; a heat processing section configured to subject each substrate, with the coating film formed thereon, to a heat process at a temperature not lower than the lower limit of temperature; a transfer mechanism configured to transfer each substrate, with the coating film formed thereon, from the substrate supporting section to the heat processing section; and a control section configured to execute control for distinguishing the substrates from each other in accordance with a first state and a second state where an elapsed time length since formation of the coating film is shorter and not shorter, respectively, than a predetermined time length, holding each substrate having the first state at the preparatory temperature by the heat processing section, and then subjecting the substrate having the first state to a heat process at a temperature not lower than the lower limit of temperature, and subjecting each substrate having the second state to a heat process by the heat processing section at a temperature not lower than the lower limit of temperature, without holding the substrate having the second state at the substrate supporting section.

In the fifth aspect, the substrate supporting section may be configured to localize the predetermined component in the coating film.

In the third to fifth aspects, it may be arranged such that the substrate supporting section includes a supporting plate configured to support each substrate thereon, and the heat processing section includes a heating plate configured to heat each substrate thereon, while the supporting plate and the heating plate are disposed in one casing. In this case, the transfer mechanism may be configured to move the supporting plate with each substrate supported thereon to a position above the heating plate, and then transfer the substrate to the heating plate. The substrate supporting section and the heat processing section may be disposed as separate units. The preparatory temperature, at which each substrate is held by the substrate supporting section, is preferably a temperature lower than a temperature for hardening or cross-linking the coating film, and is preferably within a range of 70 to 100° C. The temperature not lower than the lower limit of temperature, at which each substrate is subjected to the heat process by the heat processing section, is preferably a temperature for hardening or cross-linking the coating film.

According to a sixth aspect of the present invention, there is provided a computer readable storage medium containing a control program for execution on a computer, which, when executed, causes the computer to control a substrate processing apparatus to conduct a method according to the first or second aspect described above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
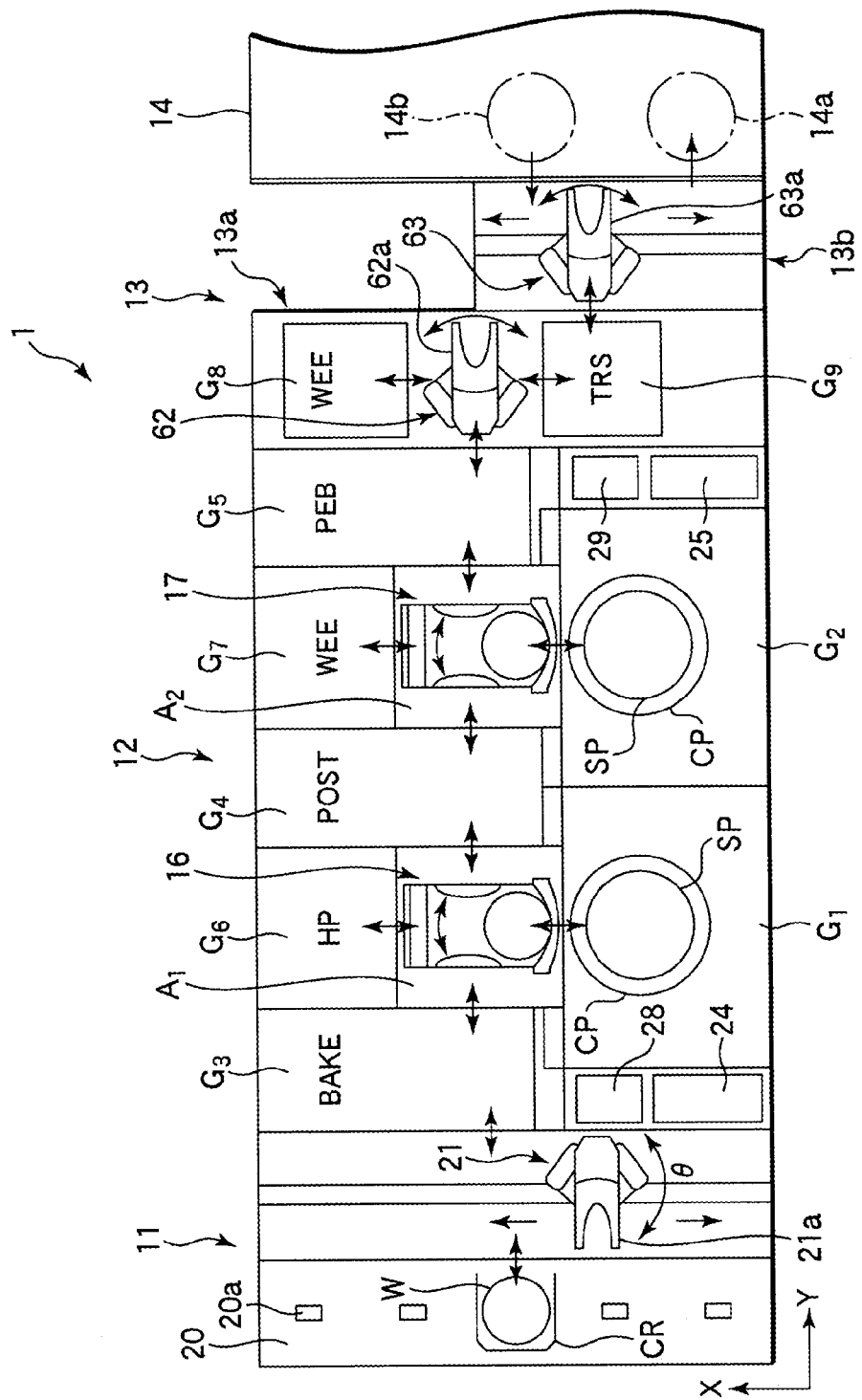
FIG. 1 is a plan view showing the entire structure of a resist coating/developing system for semiconductor wafers, which is provided with a pre-baking unit (PAB) according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

Figure 2:
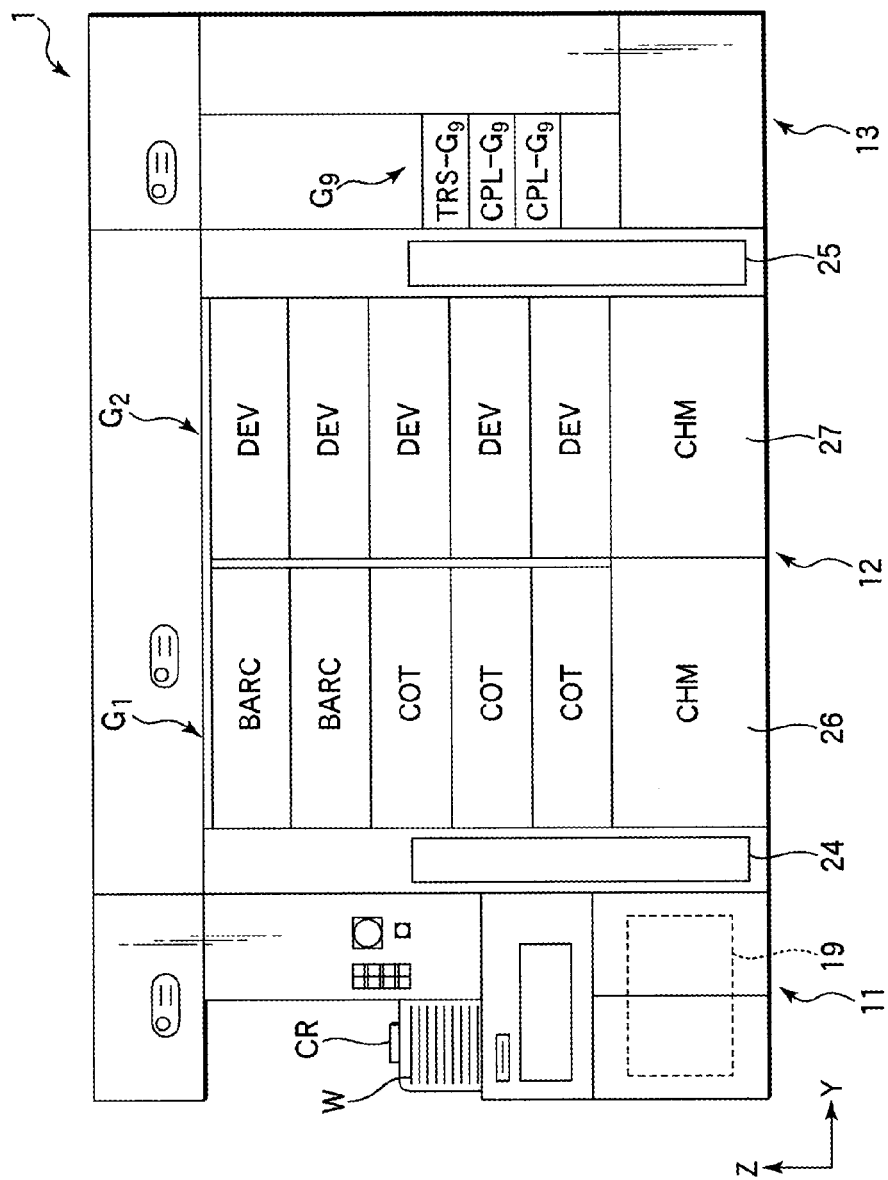
FIG. 2 is a front view of the resist coating/developing system shown in FIG. 1.
Figure 3:
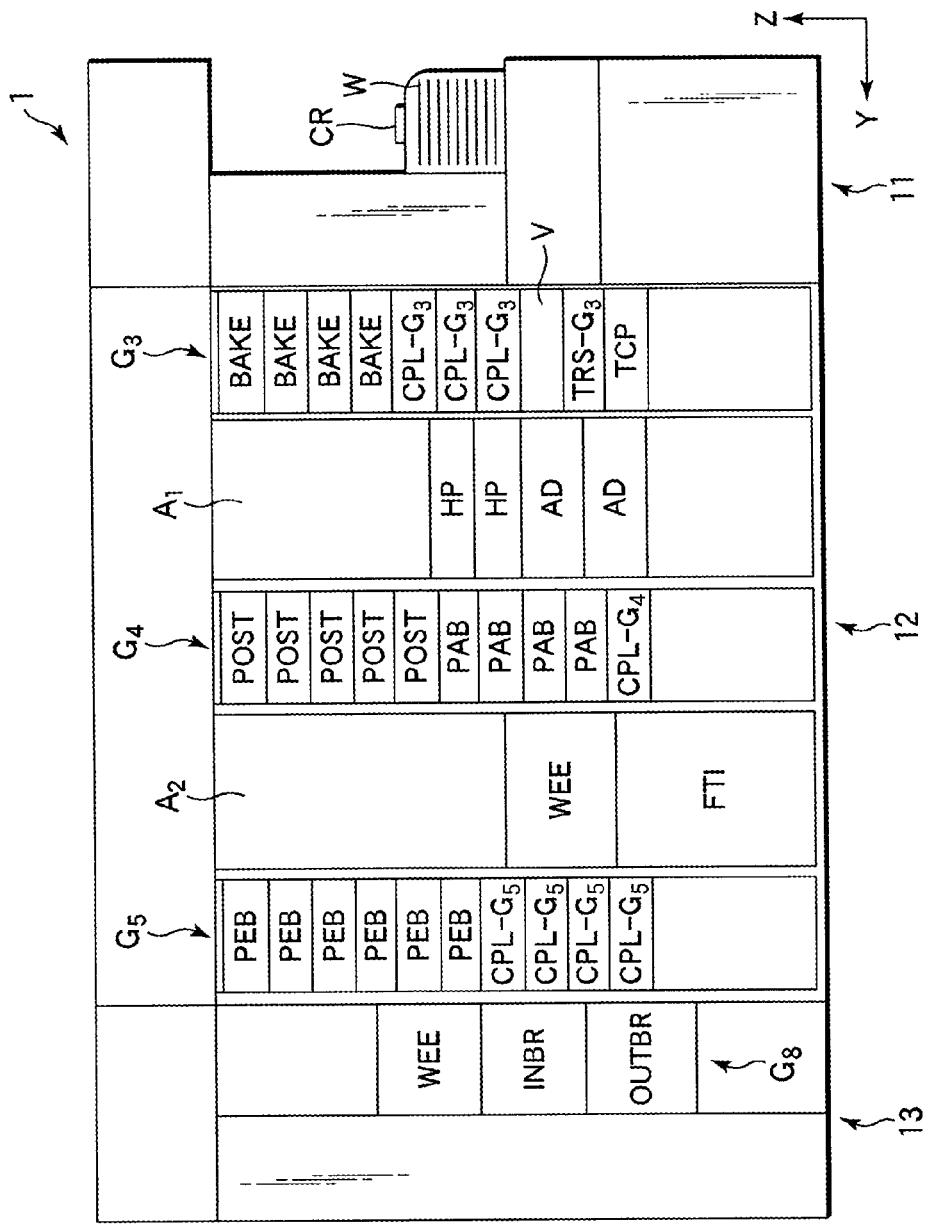
FIG. 3 is a back view of the resist coating/developing system shown in FIG. 1.

FIG. 1 is a plan view schematically showing a resist coating/developing system provided with a pre-baking unit (PAB) according to an embodiment of the present invention. FIGS. 2 and 3 are a front view and a back view, respectively, of the resist coating/developing system shown in FIG. 1.

This resist coating/developing system 1 includes a transfer station used as a cassette station 11, a process station 12 comprising a plurality of processing units, and an interface station 13 located adjacent to the process station 12 and configured to transfer wafers W between a light exposure apparatus 14 and the process station 12.

The cassette station 11 is used such that wafer cassettes (CR) are transferred thereto from other systems, wherein each of these wafer cassettes (CR) horizontally stores a plurality of wafers W to be processed in the resist coating/developing system 1. The cassette station 11 is also arranged such that wafer cassettes (CR) are transferred therefrom to other systems, wherein each of these wafer cassettes (CR) stores wafers W processed in the resist coating/developing system 1. Further, the cassette station 11 is used to transfer wafers W between the wafer cassettes (CR) and process station 12.

As shown in FIG. 1, the cassette station 11 includes a cassette table 20 having a plurality of (five in FIG. 1) positioning projections 20a formed thereon in a row in an X-direction. A wafer cassette (CR) is placed at each of the projections 20a such that its wafer transfer port faces the process station 12.

The cassette station 11 is provided with a wafer transfer mechanism 21 located between the cassette table 20 and process station 12. This wafer transfer mechanism 21 includes a wafer transfer pick 21a, which is movable in a cassette array direction (X-direction) and in a wafer array direction (Z-direction) of the wafers W stored in each wafer cassette (CR), and is further rotatable in a θ-direction show in FIG. 1. With the arrangement described above, the wafer transfer pick 21a can access any one of the wafer cassettes (CR), and also can access a transition unit (TRS-$G_3$) located in a third processing unit group $G_3$ of the process station 12 described later.

On the front side of the system, the process station 12 includes a first processing unit group $G_1$ and a second processing unit group $G_2$ arrayed in this order from the cassette station 11. Further, on the rear side of the system, the process station 12 includes a third processing unit group $G_3$, a fourth processing unit group $G_4$, and a fifth processing unit group $G_5$ arrayed in this order from the cassette station 11. A first main transfer section $A_1$ is interposed between the third processing unit group $G_3$ and fourth processing unit group $G_4$. A second main transfer section $A_2$ is interposed between the fourth processing unit group $G_4$ and fifth processing unit group $G_5$. A sixth processing unit group $G_6$ is located on the rear side of the first main transfer section $A_1$. A seventh processing unit group $G_7$ is located on the rear side of the second main transfer section $A_2$.

As shown in FIGS. 1 and 2, the first processing unit group $G_1$ includes five processing units of the spinner type stacked one on the other, which are used as liquid supply units each for performing a predetermined process on a wafer W placed on a spin chuck SP inside a cup (CP). For example, the five processing units are formed of three resist coating units (COT) and two bottom coating units (BARC) for forming an anti-reflective coating that prevents reflection of light during light exposure. The second processing unit group $G_2$ includes five processing units of the spinner type, such as development units (DEV), stacked one on the other.

The third processing unit group $G_3$ includes ten units or the like stacked one on the other, as shown in FIG. 3, which are formed of a temperature adjusting unit (TCP), a transition unit (TRS-$G_3$), a spare space V, three high-precision temperature adjusting units (CPL-$G_3$), and four high-temperature heat processing units (BAKE) in this order from below. The transition unit (TRS-$G_3$) is used as a portion for transferring a wafer W between the cassette station 11 and first main transfer section $A_1$. The spare space V is used for attaching a desired processing unit of the oven type, such as a processing unit of the oven type for performing a predetermined process on a wafer W placed on a worktable. Each of the high-precision temperature adjusting units (CPL-$G_3$) is used for performing a heat process on a wafer W at a temperature controlled with high precision. Each of the high-temperature heat processing units (BAKE) is used for performing a predetermined heat process on a wafer W.

The fourth processing unit group $G_4$ includes ten units or the like stacked one on the other, as shown in FIG. 3, which are formed of a high-precision temperature adjusting unit (CPL-$G_4$), four pre-baking units (PAB), and five post baking units (POST) in this order from below. Each of the pre-baking units (PAB) is used for performing a heat process on a wafer W after resist coating. Each of the post baking units (POST) is used for performing a heat process on a wafer W after a developing process. Each of the pre-baking units (PAB) in the fourth processing unit group $G_4$ is structured according to this embodiment and has a heating sub-unit and an aging sub-unit, as described later.

The fifth processing unit group $G_5$ includes ten units or the like stacked one on the other, as shown in FIG. 3, which are formed of four high-precision temperature adjusting units (CPL-$G_5$) and six post exposure baking units (PEB) in this order from below. Each of the post exposure baking units (PEB) is used for performing a heat process on a wafer W after light exposure and before development.

In the third to fifth processing unit groups $G_3$ to $G_5$, the number and position of units stacked one on the other are not limited to those shown in the drawings, and they can be arbitrarily preset.

The sixth processing unit group $G_6$ includes four units or the like stacked one on the other, which are formed of two adhesion units (AD) and two heating units (HP) for heating a wafer W in this order from below. Each of the adhesion units (AD) may have a mechanism for adjusting the temperature of a wafer W. The seventh processing unit group $G_7$ includes two units or the like stacked one on the other, which are formed of a film thickness measuring unit (FTI) and a periphery light exposure unit (WEE) in this order from below. The film thickness measuring unit (FTI) is used for measuring the thickness of a resist film. The periphery light exposure unit (WEE) is used for performing light exposure selectively only on the edge portion of a wafer W. A plurality of periphery light exposure units (WEE) may be used and stacked one the other. Further, on the rear side of the second main transfer section $A_2$, a heat processing unit, such as a heating unit (HP), may be disposed, as in the rear side of the first main transfer section $A_1$.

The first main transfer section $A_1$ is provided with a first main wafer transfer unit 16, which can selectively access the units located in the first processing unit group $G_1$, third processing unit group $G_3$, fourth processing unit group $G_4$, and sixth processing unit group $G_6$. The second main transfer section $A_2$ is provided with a second main wafer transfer unit 17, which can selectively access the units located in the second processing unit group $G_2$, fourth processing unit group $G_4$, fifth processing unit group $G_5$, and seventh processing unit group $G_7$.

Figure 4:
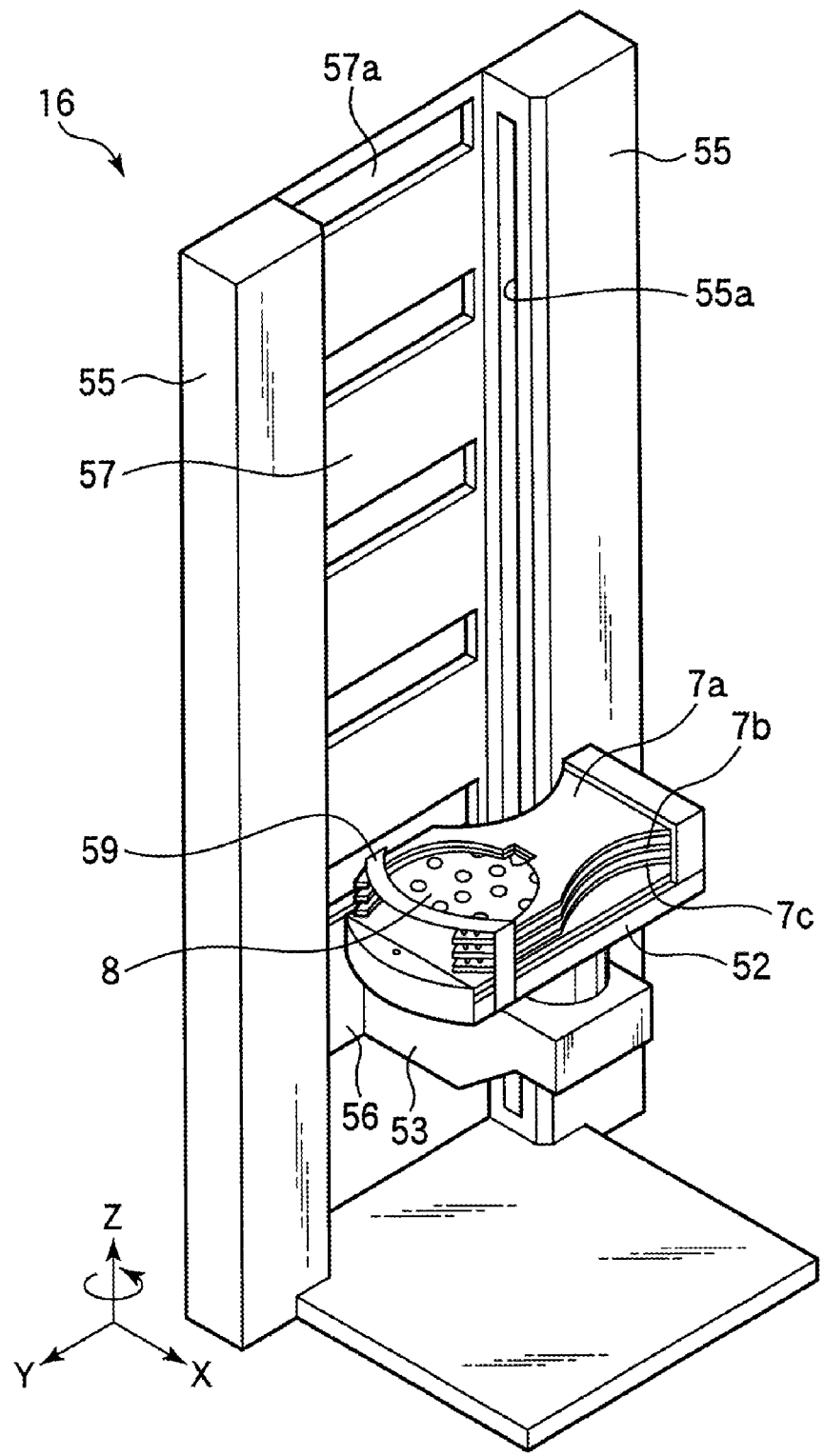
FIG. 4 is a perspective view schematically showing the structure of a main wafer transfer unit used in the resist coating/developing system shown in FIG. 1.

As shown in FIG. 4, the first main wafer transfer unit 16 includes three arms 7a, 7b, and 7c each for holding a wafer W. These arms 7a to 7c are movable back and forth along a base plate 52. The base plate 52 is rotatably supported by a support portion 53 and can be rotated by a motor built in the support portion 53. The support portion 53 is movable up and down along support struts 55 extending in the vertical direction. The support struts 55 are respectively provided with sleeves 55a extending in a vertical direction, while a flange portion 56 laterally projected from the support portion 53 slidably engages with sleeves 55a. The support portion 53 can be moved up and down by an elevating mechanism (not shown) through the flange portion 56. With this arrangement, the arms 7a to 7c of the first main wafer transfer unit 16 are movable in the X-direction, Y-direction, and Z-direction, and is rotatable in the X-Y plane. Consequently, as described above, the first main wafer transfer unit 16 can selectively access the units located in the first processing unit group $G_1$, third processing unit group $G_3$, fourth processing unit group $G_4$, and sixth processing unit group $G_6$.

A shield plate 8 is attached between the arm 7a and arm 7b to block off radiation heat from these arms. Further, a light emitting element (not shown) of a sensor member 59 is located above the distal end of the uppermost arm 7a, while a light receiving element (not shown) is attached at the distal end of the base plate 52. The light emitting element and light receiving element constitute an optical sensor to confirm the presence/absence and protruding of a wafer W on each of the arms 7a to 7c. FIG. 4 also shows a wall portion 57 as a part of the housing of the first main transfer section $A_1$ on the first processing unit group $G_1$ side. The wall portion 57 has window portions 57a formed therein, through which a wafer W is transferred to and from the respectively units of the first processing unit group $G_1$. The second main wafer transfer unit 17 has the same structure as that of the first main wafer transfer unit 16.

A liquid temperature adjusting pump 24 and a duct 28 are located between the first processing unit group $G_1$ and cassette station 11. A liquid temperature adjusting pump 25 and a duct 29 are located between the second processing unit group $G_2$ and interface station 13. The liquid temperature adjusting pumps 24 and 25 are used for supplying predetermined process liquids to the first processing unit group $G_1$ and second processing unit group $G_2$, respectively. The ducts 28 and 29 are used for supplying clean air into the processing unit groups $G_1$ to $G_5$ from an air conditioner (not shown) located outside the resist coating/developing system 1.

The first to seventh processing unit groups $G_1$ to $G_7$ are detachable for a maintenance operation. The rear side panel of the process station 12 is also detachable or openable.

Further, chemical units (CHM) 26 and 27 are respectively located below the first processing unit group $G_1$ and second processing unit group $G_2$ and are used for supplying predetermined process liquids to the first processing unit group $G_1$ and second processing unit group $G_2$.

The interface station 13 comprises a first interface station 13a on the process station 12 side, and a second interface station 13b on the light exposure apparatus 14 side. The first interface station 13a is provided with a first wafer transfer device 62 that faces an opening of the fifth processing unit group $G_5$. The second interface station 13b is provided with a second wafer transfer device 63 movable in the X-direction.

An eighth processing unit group $G_8$ is located on the rear side of the first wafer transfer device 62. The eighth processing unit group $G_8$ includes units or the like stacked one on the other, as shown in FIG. 3, which are formed of an outgoing buffer cassette (OUTBR), an incoming buffer cassette (INBR), and a periphery light exposure unit (WEE) in this order from below. The outgoing buffer cassette (OUTBR) is used for temporarily placing wafers W transferred from the light exposure apparatus 14. The incoming buffer cassette (INBR) is used for temporarily placing wafers W to be transferred into the light exposure apparatus 14. Each of the incoming buffer cassette (INBR) and outgoing buffer cassette (OUTBR) is configured to accommodate a plurality of, e.g., 25, wafers W. Further, a ninth processing unit group $G_9$ is located on the front side of the first wafer transfer device 62. The ninth processing unit group $G_9$ includes units or the like stacked one on the other, as shown in FIG. 2, which are formed of two high-precision temperature adjusting units (CPL-$G_9$) and a transition unit (TRS-$G_9$) in this order from below.

The first wafer transfer device 62 includes a wafer transfer fork 62a, which is movable in the Z-direction, rotatable in the θ-direction, and further movable back and forth in the X-Y plane. This fork 62a can selectively access the units located in the fifth processing unit group $G_5$, eighth processing unit group $G_8$, and ninth processing unit group $G_9$, so that wafers W can be transferred among these units.

Similarly, the second wafer transfer device 63 includes a wafer transfer fork 63a, which is movable in the X-direction and Z-direction, rotatable in the θ-direction, and further movable back and forth in the X-Y plane. This fork 63a can selectively access the units located in the ninth processing unit group $G_9$, and an incoming stage 14a and an outgoing stage 14b of the light exposure apparatus 14, so that wafers W can be transferred among these portions.

Figure 5:
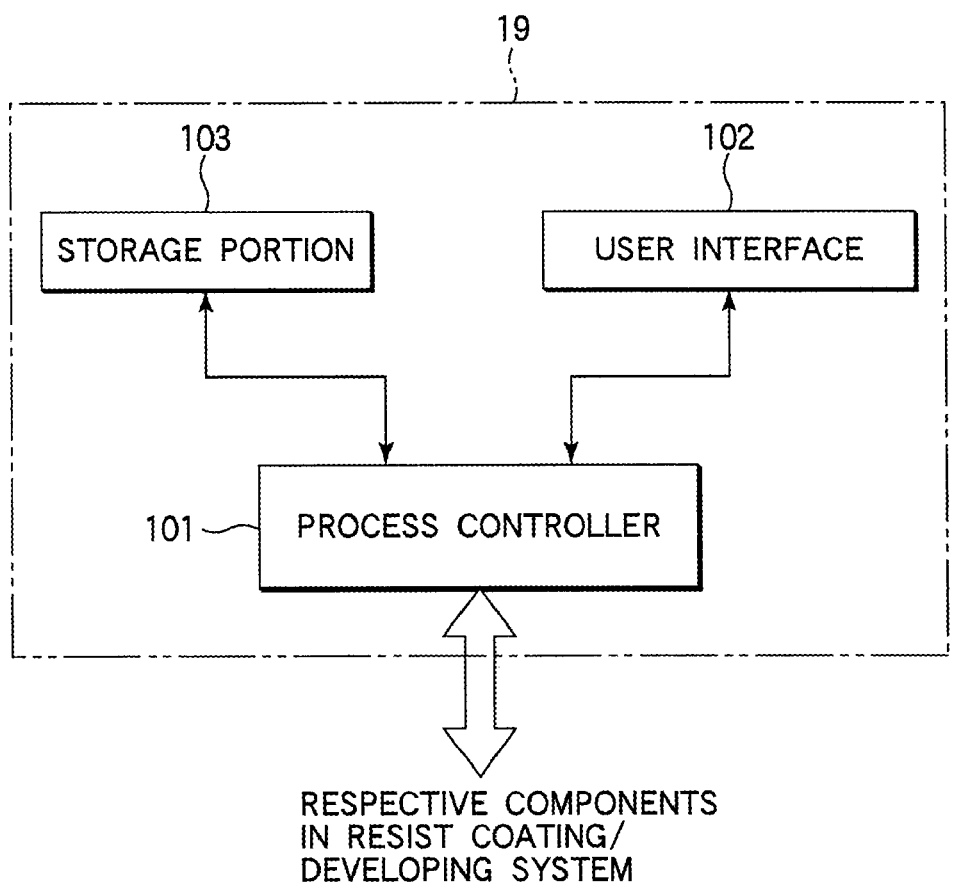
FIG. 5 is a block diagram showing a control system used in the resist coating/developing system shown in FIG. 1.

As shown in FIG. 2, a central control section 19 is located below the cassette station 11 and is used for controlling this resist coating/developing system 1, as a whole. As shown in FIG. 5, this central control section 19 includes a process controller 101 comprising a CPU for controlling the respective components included in the resist coating/developing system 1, such as the processing units and transfer mechanisms. The process controller 101 is connected to the user interface 102, which includes, e.g., a keyboard and a display, wherein the keyboard is used for a process operator to input commands for operating the respective components in the resist coating/developing system 1, and the display is used for showing visualized images of the operational status of the respective components in the resist coating/developing system 1. Further, the process controller 101 is connected to the storage portion 103, which stores recipes with control programs and process condition data recorded therein, for realizing various processes performed in the resist coating/developing system 1 under the control of the process controller 101.

A required recipe is retrieved from the storage portion 103 and executed by the process controller 101 in accordance with an instruction or the like input through the user interface 102. Consequently, each of various predetermined processes is performed in the resist coating/developing system 1 under the control of the process controller 101. Recipes may be stored in a computer readable storage medium, such as a CD-ROM, hard disk, flexible disk, or nonvolatile memory. Further, recipes may be utilized on-line, while it is transmitted from a suitable apparatus through, e.g., a dedicated line, as needed. The processing units are respectively provided with their own subordinate unit controllers, which control the operation of the respective units in accordance with instructions transmitted from the process controller 101.

In the resist coating/developing system 1 arranged as described above, unprocessed wafers W are taken out one by one from a wafer cassette (CR) by the wafer transfer mechanism 21. A wafer W thus taken out is transferred by the wafer transfer mechanism 21 into the transition unit (TRS-$G_3$) located in the processing unit group $G_3$ of the process station 12. Then, the wafer W receives a temperature adjusting treatment in the temperature adjusting unit (TCP). Then, the wafer W is sequentially subjected to formation of an anti-reflective coating performed by one of the bottom coating units (BARC) of the first processing unit group $G_1$, a heat process performed by one of the heating units (HP), and a baking process performed by one of the high-temperature heat processing units (BAKE). Before the formation of an anti-reflective coating on the wafer W performed by one of the bottom coating units (BARC), the wafer W may be subjected to an adhesion process performed by one of the adhesion units (AD). Then, the wafer W receives a temperature adjusting treatment in the high-precision temperature adjusting unit (CPL-$G_4$). Then, the wafer W is transferred into one of the resist coating units (COT) located in the first processing unit group $G_1$, in which the wafer W is subjected to a process for applying a resist liquid. Thereafter, the wafer W is sequentially subjected to a pre-baking process performed by one of the pre-baking units (PAB) located in the fourth processing unit group $G_4$, and a periphery light exposure process performed by one of the periphery light exposure units (WEE). Then, the wafer W receives a temperature adjusting treatment in the high-precision temperature adjusting unit (CPL-$G_4$) or the like. Thereafter, the wafer W is transferred by the second wafer transfer device 63 into the light exposure apparatus 14. After the wafer W is subjected to a light exposure process performed by the light exposure apparatus 14, the wafer W is transferred by the second wafer transfer device 63 into the transition unit (TRS-$G_9$). Then, the wafer W is transferred by the first wafer transfer device 62 into one of the post exposure baking units (PEB) located in the fifth processing unit group $G_5$, in which the wafer W is subjected to a post exposure baking process. Further, the wafer W is transferred into one of the development units (DEV) located in the second processing unit group $G_2$, in which the wafer W is subjected to a developing process. Then, the wafer W is subjected to a post baking process performed by the post baking unit (POST). Then, the wafer W receives a temperature adjusting treatment in one of the high-precision temperature adjusting units (CPL-$G_3$). Then, the wafer W is transferred through the transition unit (TRS-$G_3$) to a predetermined position in a wafer cassette (CR) placed on the cassette station 11.

Next, a detailed explanation will be given of the pre-baking unit (PAB) according to this embodiment of the present invention.

Figure 6:
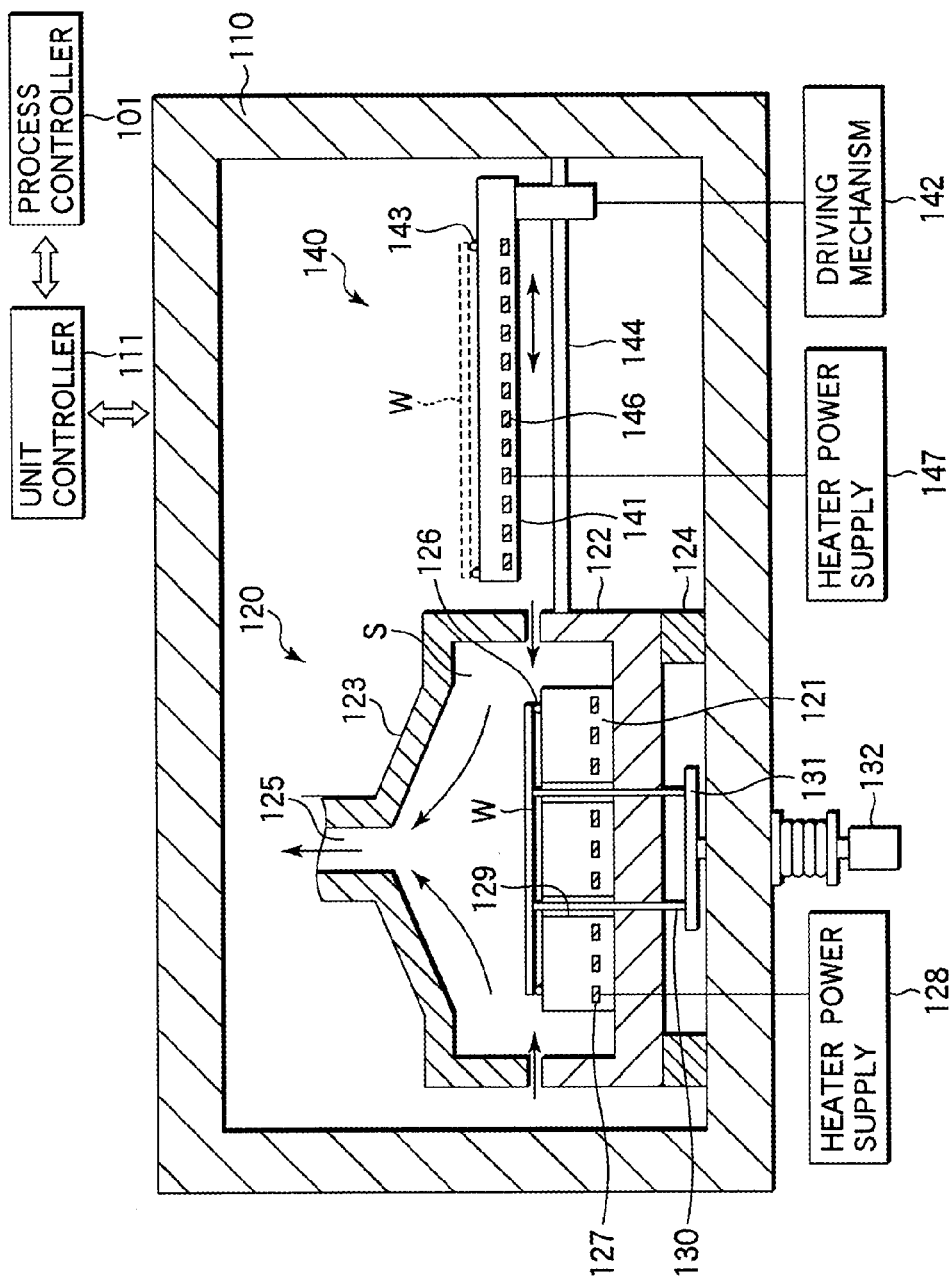
FIG. 6 is a sectional view showing the pre-baking unit (PAB) according to this embodiment of the present invention.
Figure 7:
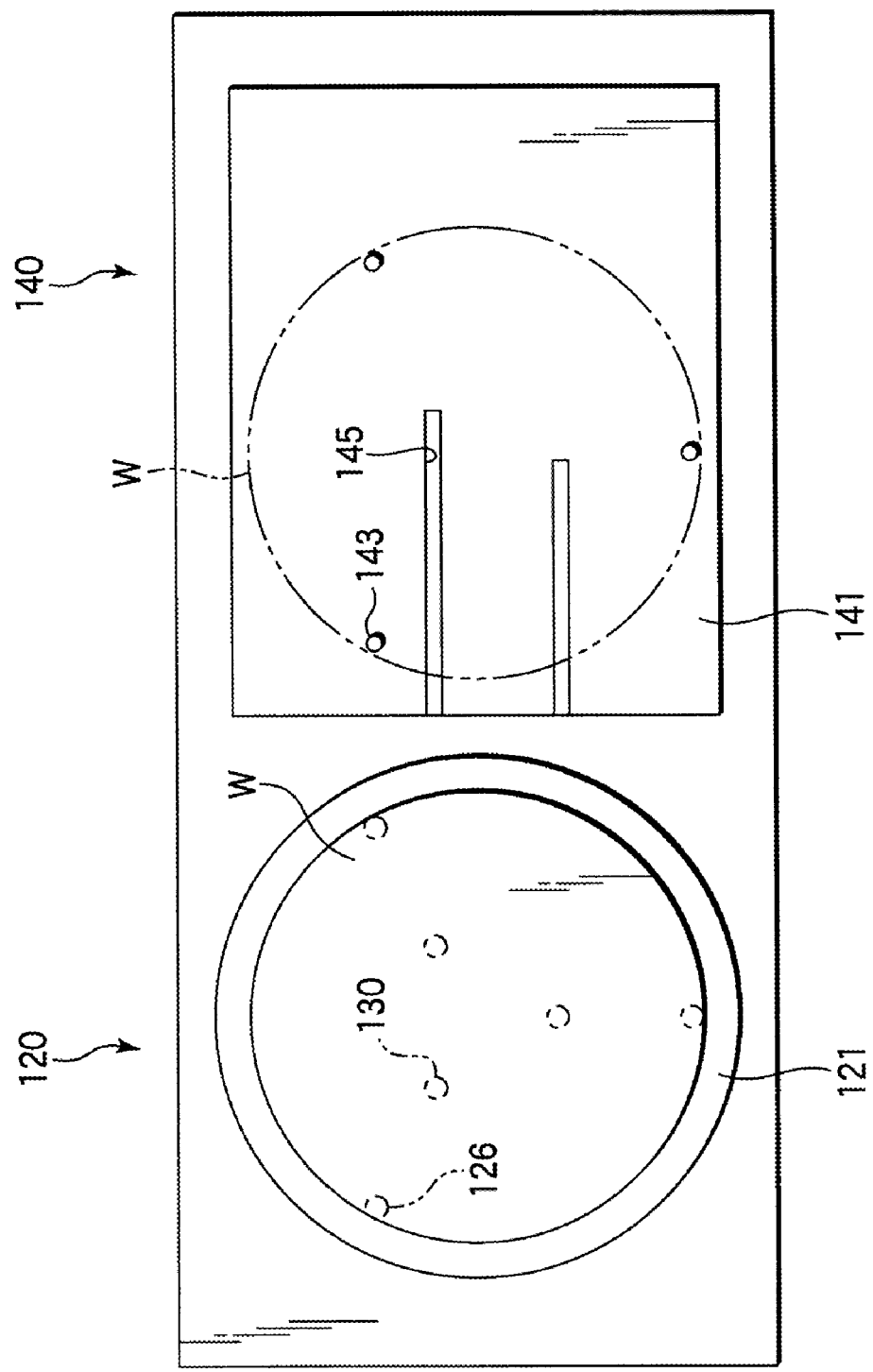
FIG. 7 is a plan view schematically showing the interior of the pre-baking unit (PAB) according to this embodiment of the present invention.

FIG. 6 is a sectional view showing the pre-baking unit (PAB) according to this embodiment. FIG. 7 is a plan view schematically showing the interior of the pre-baking unit (PAB).

This pre-baking unit (PAB) includes a casing 110, in which a heating sub-unit (heat processing section) 120 is located on one side, and an aging sub-unit (substrate supporting section) 140 is located on the other side.

The heating sub-unit (heat processing section) 120 is used for performing a heat process on a wafer W to bake and cure (harden by baking) a coating film, and thus includes a heating plate 121 like a circular plate for heating a wafer W. The heating plate 121 is supported within the inner space of a support member 122 having a compressed cylindrical shape opened upward. The upper side of the support member 122 is covered with a cover 123 having a conical shape with height gradually increased from the peripheral portion to the central portion. The cover 123 has an exhaust port 125 formed at the top of the central portion and connected to an exhaust line. The cover 123 can be moved up and down by an elevating mechanism (not shown). When the cover 123 is set at the upper position, the wafer W can be loaded and unloaded to and from the heating plate 121. When the cover 123 is set at the lower position, the lower end of the cover 123 comes into close contact with the upper end of the support member 122 to form a heat processing space S. The support member 122 is fixed on a spacer 124 placed on the bottom of the casing 110.

The heating plate 121 is made of, e.g., aluminum, and is provided with proximity pins 126 on the surface. The wafer W is placed on the proximity pins 126 to be adjacent to the heating plate 121. The heating plate 121 has an electric heater 127 built therein with a predetermined pattern. Electricity is applied from a heater power supply 128 to this electric heater 127 to set the heating plate 121 at a predetermined temperature. The heating temperature is controlled by means of feedback control using a thermo couple (not shown) located near the surface of the heating plate 121.

The heating plate 121 has three through holes 129 formed therein at the central portion (only two of them are shown in FIG. 6). Lifter pins 130 are respectively inserted in these through holes 129 and are movable up and down to move the wafer W up and down. The lifter pins 130 are attached to a support plate 131 and are moved up and down along with the support plate 131 by a cylinder mechanism 132 located below the casing 110.

The aging sub-unit (substrate supporting section) 140 is used for performing an aging process arranged to hold the wafer W at a temperature lower than that for baking and curing the coating film, (i.e., at a preparatory temperature lower than the lower limit of temperature for baking and curing the coating film). The aging sub-unit 140 includes a supporting plate 141 and a driving mechanism 142 for moving the supporting plate 141 in a horizontal direction to transfer the wafer W to and from the heating sub-unit 120. The supporting plate 141 is provided with proximity pins 143 thereon, so that the wafer W is placed on the proximity pins 143 to be adjacent to the supporting plate 141 during the aging process. The driving mechanism 142 comprises a suitable mechanism, such as a belt mechanism or ball screw mechanism, to move the supporting plate 141 along a guide 144. When the wafer W is transferred to and from the heating plate 121, the supporting plate 141 is moved to the heating sub-unit (heat processing section) 120 side. When the aging process is performed, the supporting plate 141 is set at a reference position shown in FIG. 6. In order to prevent the supporting plate 141 thus moved from interfering with the lifter pins 130, the supporting plate 141 has grooves 145 extending in the transfer direction of the supporting plate 141, as shown in FIG. 7.

The supporting plate 141 has an electric heater 146 built therein with a predetermined pattern. Electricity is applied from a heater power supply 147 to this electric heater 146 to set the supporting plate 141 at a predetermined temperature. The temperature of the supporting plate 141 is controlled by means of feedback control using a thermo couple (not shown) located near the surface of the supporting plate 141. The supporting plate 141 is used for localizing a predetermined component in the coating film applied and formed on the wafer W, so that the distribution of the predetermined component becomes constant among wafers. Accordingly, the temperature used here can be suitably set in accordance with this purpose, wherein heating is not essential. Where the temperature is controlled around room temperature, temperature adjusting water or the like may be circulated in the supporting plate 141 to control the temperature.

The pre-baking unit (PAB) includes a unit controller 111 for controlling the pre-baking unit (PAB) in accordance with instructions transmitted from the process controller 101 of the resist coating/developing system 1. For example, the unit controller 111 takes on driving control of the supporting plate 141 by the driving mechanism 142, and temperature control of the heating plate 121 and supporting plate 141.

Figure 8:
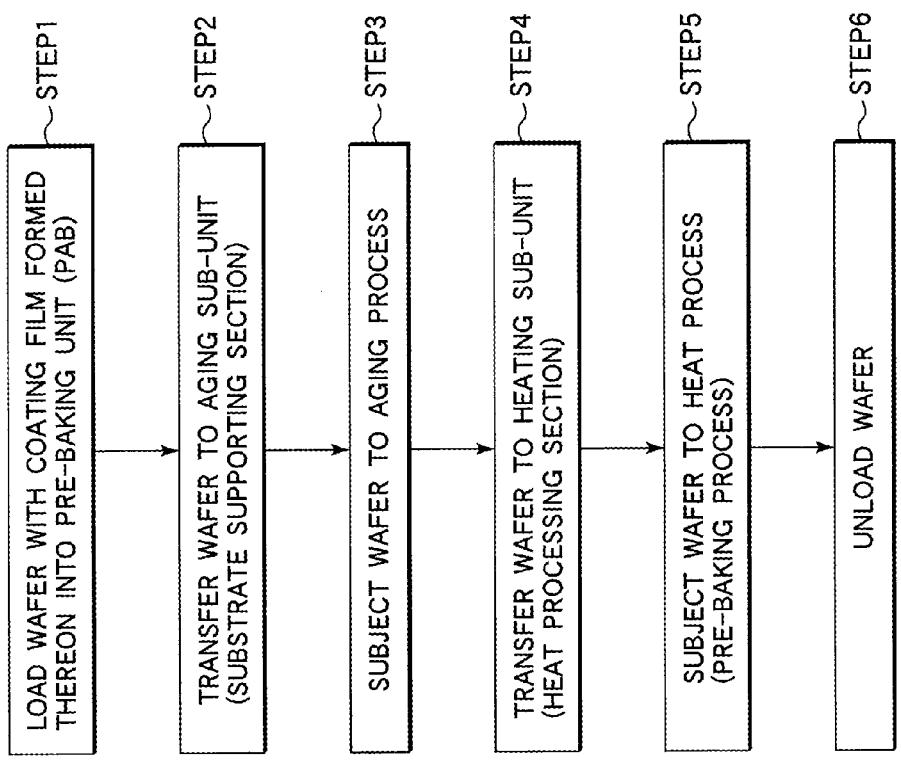
FIG. 8 is a flowchart showing an example of a process performed in the pre-baking unit (PAB), according to an embodiment of the present invention.

Next, an explanation will be given of a processing method performed in the pre-baking unit (PAB) arranged as described above, with reference to the flowchart shown in FIG. 8. This explanation will be given of a series of steps from the time a coating film is formed on a wafer W by applying a coating liquid, such as resist liquid or BARC chemical solution, to the time the process on the wafer W is finished in the pre-baking unit (PAB).

At first, a coating liquid, such as resist liquid, is applied onto a wafer W to form a coating film thereon in a resist coating unit (COT). Then, this wafer W is transferred to the pre-baking unit (PAB) and loaded into the casing 110 (Step 1). Then, the wafer W is transferred to the aging sub-unit (substrate supporting section) 140 and is placed on the proximity pins 143 of the supporting plate 141 (Step 2).

Figure 9A:
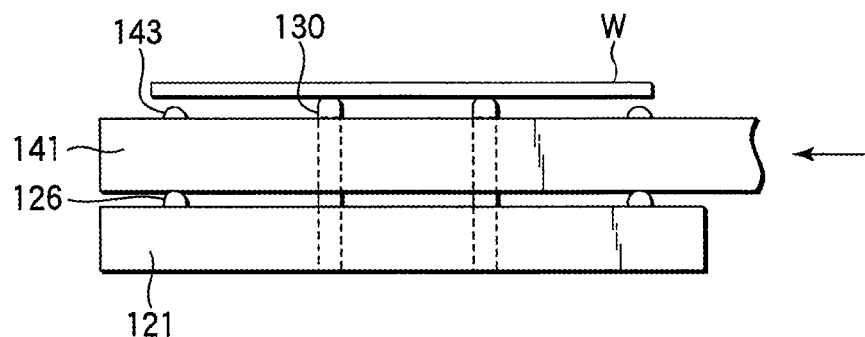
FIGS. 9A to 9C are views schematically showing the pre-baking unit (PAB) according to this embodiment of the present invention, to explain procedures for transferring a wafer from a heating sub-unit (heat processing section) to an aging sub-unit (substrate supporting section)
Figure 9B:
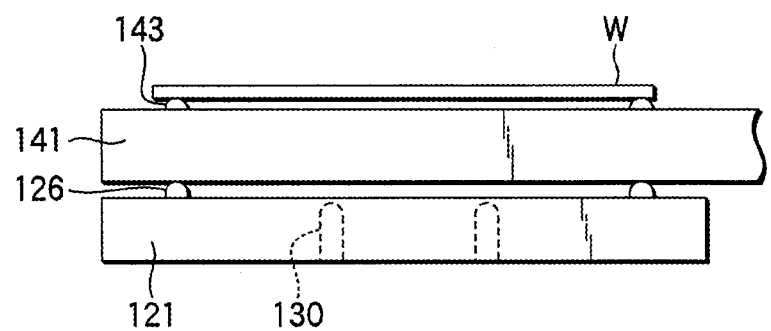
Figure 9C:
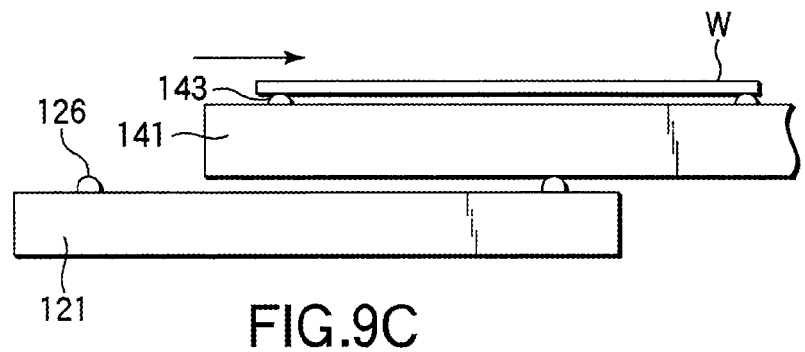

At this time, as shown in FIG. 9A, the wafer W is placed on the lifter pins 130, set at the upper position, of the heating plate 121, and then the supporting plate 141 is moved to a position above the heating plate 121. Then, as shown in FIG. 9B, the lifter pins 130 is moved down to place the wafer W on the proximity pins 143 of the supporting plate 141. Then, as shown in FIG. 9C, the supporting plate 141 supporting the wafer W is moved to the original position.

In this state, the wafer W supported on the supporting plate 141 is subjected to an aging process (Step 3). The aging process is performed for adjusting the distribution of a predetermined component in the coating film before the baking process is performed by the heating sub-unit 120, i.e., before the process for baking and curing the coating film formed on the wafer W is performed. Accordingly, the aging process is performed at a temperature lower than that for baking and curing the coating film, (i.e., at a preparatory temperature lower than the lower limit of temperature for baking and curing the coating film).

This aging process will be explained in detail with reference to the schematic views shown in FIGS. 10 to 13.

Figure 10:
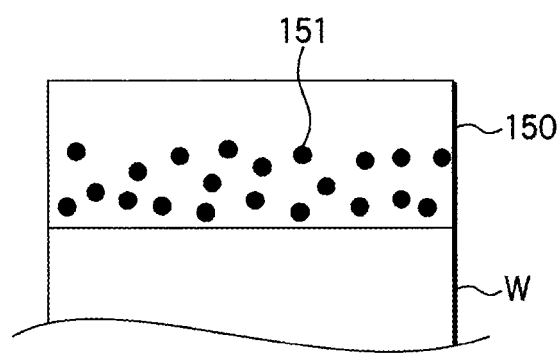
FIG. 10 is a view schematically showing an aging process performed in the pre-baking unit (PAB), according to an embodiment of the present invention.

As shown in FIG. 10, immediately after a coating film is formed on a wafer W, a predetermined component 151 is essentially uniformly dispersed in the coating film 150, and thus the composition distribution is essentially uniform. However, when wafers W are loaded into the pre-baking unit (PAB), the distribution of the predetermined component in the coating film in a semi-dried state may differ among the wafers.

Figure 11A:
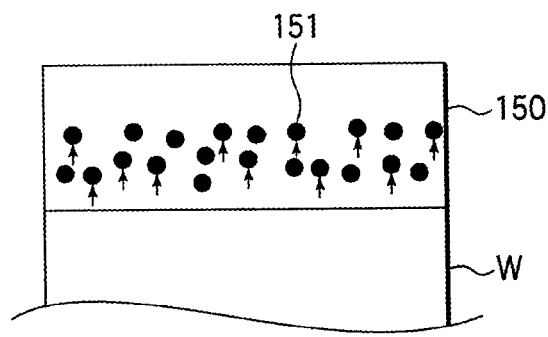
FIGS. 11A and 11B are views schematically showing an aging process performed in the pre-baking unit (PAB), according to an embodiment of the present invention.
Figure 11B:
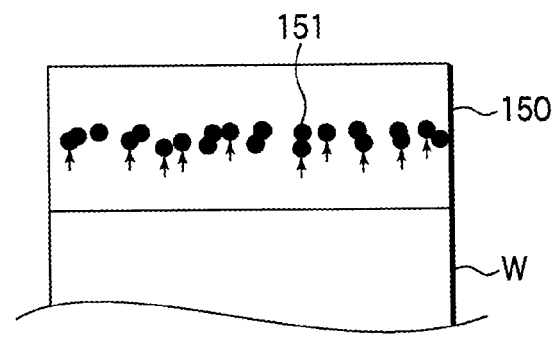
Figure 12:
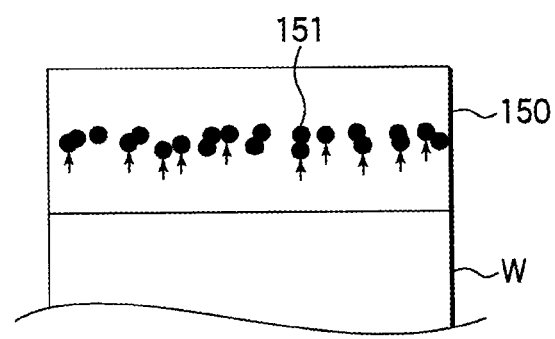
FIG. 12 is a view schematically showing an aging process performed in the pre-baking unit (PAB), according to an embodiment of the present invention.

Such fluctuations in the distribution of a predetermined component are caused due to different time lengths of wafers from the time each wafer is coated with a coating liquid to the time it is loaded into the pre-baking unit (PAB). Specifically, in the resist coating/developing system, the main wafer transfer unit is used for sequentially transferring a plurality of wafers to and from a plurality of processing units in accordance with the order of processes. In this case, the wafers suffer differences in, e.g., waiting time for the respective processing units, depending on the busyness of the transfer unit, so the wafers have different time lengths from the time each wafer is coated with a coating liquid to the time it is loaded into the pre-baking unit (PAB). Where such differences are caused in transfer time length, the wafers come to have the following conditions in accordance with the transfer time length being shorter or longer. Specifically, in a wafer with a shorter transfer time length, as shown in FIG. 11A, the predetermined component 151 in the coating film 150 has rarely migrated, so the distribution remains essentially the same as that shown in FIG. 10, i.e., the composition distribution is uniform. On the other hand, in a wafer with a longer transfer time length, as shown in FIG. 11B, the predetermined component 151 in the coating film 150 has greatly migrated during transfer, so the predetermined component 151 are localized. Consequently, the distribution of a predetermined component in the coating film fluctuates among wafers. In this respect, the pre-baking process carries over such distribution of a predetermined component as it is, and the distribution of a predetermined component thereby still fluctuations among wafers even after the coating film is baked and cured. In recent years, since circuit patterns used for semiconductor devices have become drastically smaller, such fluctuations in the distribution of a predetermined component among wafers, remaining after the coating film is baked and cured, can make the line width (CD) unequal among the wafers.

According to this embodiment, as described above, the pre-baking unit (PAB) is provided with the aging sub-unit 140, which is used, prior to a process for baking and curing a coating film, to perform an aging process, i.e., Step 3, at a temperature lower than that for baking and curing the coating film. This process is conceived to cause all wafers to have a state shown in FIG. 12, in which the predetermined component 151 is localized and fixed in the coating film 150, without depending on the transfer time length of the wafers. Consequently, after a heat process (baking process) is performed to bake and cure the coating film, as described later, the distribution of the predetermined component is constant among the wafers, thereby suppressing fluctuations in the line width (CD) among the wafers.

The temperature of the aging process can be suitably set in accordance with the property of a component that tends to suffer fluctuations in distribution, as long as the temperature is lower than that for baking and curing the coating film. Further, in general, to bake and cure a coating film means to cause a hardening or cross-linking reaction in the coating film. Accordingly, the temperature of the aging process is preferably set to be lower than temperature for causing a hardening or cross-linking reaction in the coating film, and is preferably set to 70 to 100° C., specifically. Room temperature may be adequately usable as the aging temperature, depending on the type of a coating liquid. However, where heating by the supporting plate 141 is used, the aging time can be shortened, thereby improving the throughput, as compared to an aging process using room temperature.

The time length of the aging process can also be suitably set in accordance with the type of a coating liquid, as long as the time length is sufficient to bring about a desired distribution state of a predetermined component. For example, an experiment may be conducted in advance to obtain a time length for attaining a desired distribution state of a predetermined component in every type of a coating liquid, so that the aging process can be performed for the time length thus obtained.

Figure 13:
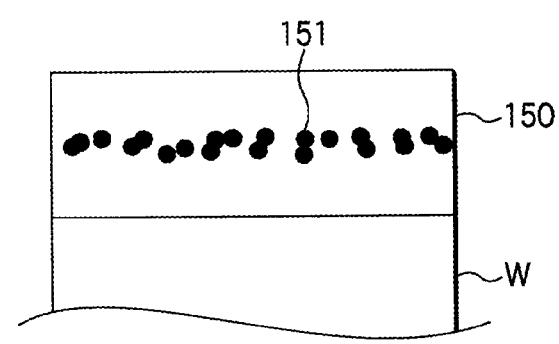
FIG. 13 is a view schematically showing an aging process performed in the pre-baking unit (PAB), according to an embodiment of the present invention.

After the aging process is performed, the wafer W is transferred to the heating sub-unit (heat processing section) 120 (Step 4). In this Step 4, the supporting plate 141 is moved by the driving mechanism 142 to a position above the heating plate 121 of the heating sub-unit 120. Then, the lifter pins 130 of the heating plate 121 are moved up to receive the wafer W by the lifter pins 130. Then, the lifter pins 130 is moved down to place the wafer W on the proximity pins 126 on the surface of the heating plate 121. In this state, the wafer W is subjected to a heat process (pre-baking process) (Step 5). The heating plate 121 has been heated to a predetermined temperature in advance, so the heat process is started when the wafer W is placed on the proximity pins 126. The heat process of this Step 5 is performed at a temperature for baking and curing the coating film 150 (i.e., a temperature not lower than the lower limit of temperature for baking and curing the coating film). In general, to bake and cure a coating film means to cause a hardening or cross-linking reaction in the coating film, so this heat process is preferably performed at a temperature for hardening or cross-linking the coating film. The temperature used at this time is exemplified by 110 to 130☐ for a resist film treated as the coating film, or by 190 to 210☐ for a BARC film treated as the coating film. With this heat process, as shown in FIG. 13, the predetermined component 151 in the coating film 150 is fixed with the distribution formed by the aging process, so a constant distribution is obtained among wafers.

After the heat process is finished, the wafer W is unloaded by the main wafer transfer unit from the pre-baking unit (PAB) through the transfer port (not shown) (Step 6).

Figure 14:
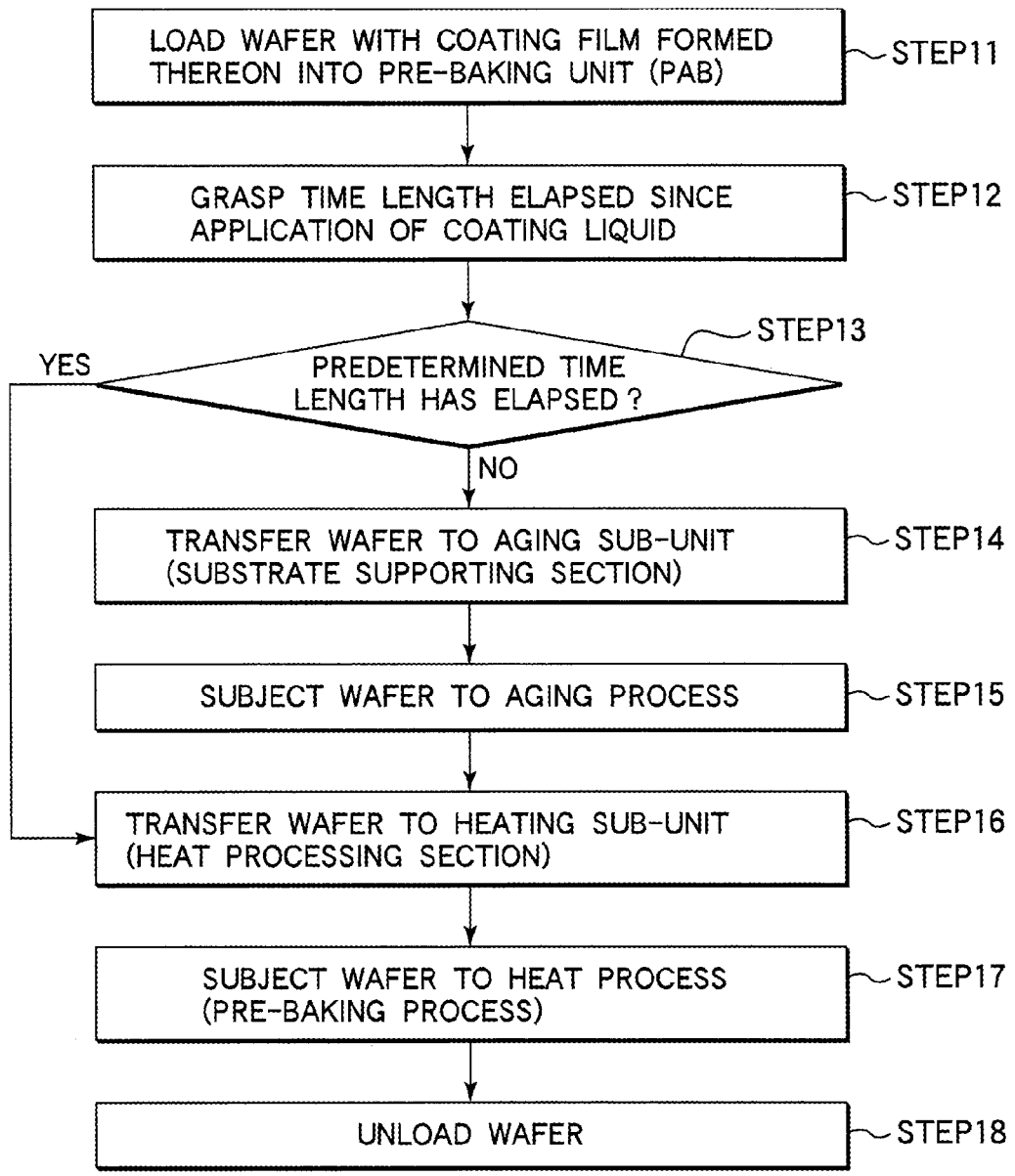
FIG. 14 is a flowchart showing an example of a process performed in the pre-baking unit (PAB), according to another embodiment of the present invention.

Next, an explanation will be given of another example of a processing method performed in the pre-baking unit (PAB), with reference to the flowchart shown in FIG. 14.

In the processing method described above, all wafers are subjected to an aging process in the aging sub-unit 140 to adjust the distribution of a predetermined component, and then to a baking process in the heating sub-unit 120. However, when a wafer is loaded into the pre-baking unit (PAB), a sufficiently long time may have elapsed since a coating liquid was applied onto the wafer. In this case, the wafer already has a desired distribution state of the predetermined component, and thus does not require the aging process. In light of this fact, according to this embodiment, the aging process is performed only on wafers that require the aging process to adjust the distribution of the predetermined component. This method will be explained in detail.

At first, as in the former method, a coating liquid, such as resist liquid, is applied onto a wafer W to form a coating film thereon in a resist coating unit (COT). Then, this wafer W is transferred to the pre-baking unit (PAB) and loaded into the casing 110 (Step 11).

Then, the ID or the like of the wafer W loaded into the casing 110 is read out for the unit controller 111 to grasp the time length elapsed since the coating liquid was applied onto the wafer W (Step 12). Then, this time length is compared with a predetermined time length preset in the unit controller 111 to judge whether or not the predetermined time length has elapsed on the wafer W (Step 13). This predetermined time length can be preset by use of an experiment performed to obtain a time length from the time the coating liquid is applied onto a wafer W to the time the predetermined component is localized, as shown in FIG. 11B. Consequently, it is possible to determine whether the wafer loaded into the casing 110 is in the state shown in FIG. 11A or in the state shown in FIG. 11B, as described above.

If it is judged in Step 13 that the predetermined time has not yet elapsed (a first state), this wafer W is transferred to the aging sub-unit (substrate supporting section) 140 and is placed on the proximity pins 143 of the supporting plate 141 (Step 14). At this time, the procedures shown in FIGS. 9A to 9C described above may be used. In this state, the wafer W supported on the supporting plate 141 is subjected to an aging process (Step 15). This aging process is performed, as in the former method.

After the aging process is performed, the wafer W is transferred to the heating sub-unit (heat processing section) 120 (Step 16). In this Step 16, the wafer W is placed on the proximity pins 126 on the surface of the heating plate 121 by the same operation as in Step 4. In this state, the wafer W is subjected to a heat process (pre-baking process) (Step 17). The heating plate 121 has been heated to a predetermined temperature in advance, so the heat process is started when the wafer W is placed on the proximity pins 126. After the heat process is finished, the wafer W is unloaded by the main wafer transfer unit from the pre-baking unit (PAB) through the transfer port (not shown) (Step 18).

On the other hand, if it is judged in Step 13 that the predetermined time has already elapsed (a second state), this wafer W is processed by the steps from Step 16. Specifically, the wafer W is transferred to the heating sub-unit (heat processing section) 120 (Step 16), and is subjected to a heat process (pre-baking process) (Step 17). Thereafter, the wafer W is unloaded from the pre-baking unit (PAB) through the transfer port (Step 18).

According to this method, the aging process is not performed on wafers that have a state where the predetermined component is localized, as shown in FIG. 11B described above, and thus do not require the aging process. Consequently, this method can shorten the total pre-baking time, thereby improving the throughput, as compared to the former method.

According to the embodiments of the present invention described above, a substrate with a coating film formed thereon is held at a preparatory temperature lower than the lower limit of temperature for baking and curing the coating film, to adjust the distribution of a predetermined component, for example, to positively localize the predetermined component. Then, the substrate is subjected to a heat process at a temperature not lower than the lower limit of temperature. With this arrangement, the distribution of the predetermined component becomes constant among the substrates before the heat process, without depending on the time length from formation of the coating film. Consequently, the distribution of the predetermined component remains constant among the substrates, after the heat process is performed to bake and cure the coating film. It follows that, even where the substrates suffer differences in transfer time length, it is possible to suppress fluctuations in the line width among the substrates.

Further, it may be arranged to distinguish substrates from each other in accordance with a first state and a second state where the elapsed time length since formation of the coating film is shorter and not shorter, respectively, than a predetermined time length. In this case, a substrate having the second state is directly subjected to a heat process at a temperature not lower than the lower limit of temperature, without being held at a temperature lower than the lower limit of temperature. This arrangement provides an additional effect of shortening the process time, thereby further improving the throughput, as compared to a case where all the substrates are held at a temperature lower than that for baking and curing the coating film without grasping the elapsed time.

The present invention is not limited to the embodiments described above, and it may be modified in various manners. For example, in the embodiments described above, the coating film is exemplified by a resist film or BARC film, but the coating film may be another film. In the embodiments described above, the heating sub-unit (heat processing section) and aging sub-unit (substrate supporting section) are integrated in one unit, but they may be disposed as separate units. The process space may be set in an atmosphere of $N_2$ or the like, or vacuum or pressure-decreased state, to perform a heat process. In the embodiments described above, the target substrate is exemplified by a wafer, but the target substrate may be another substrate, such as a substrate for flat panel displays (FPD).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing method for performing a heat process on a plurality of substrates each with a coating film formed thereon to bake and cure the coating film, while sequentially transferring the substrates, the method comprising:
    distinguishing the substrates from each other in accordance with a first state and a second state where an elapsed time length since formation of the coating film is shorter and not shorter, respectively, than a predetermined time length;
    holding each substrate having the first state at a preparatory temperature lower than a lower limit of temperature for baking and curing the coating film, to adjust distribution of a predetermined component in the coating film, and then subjecting the substrate having the first state to a heat process at a temperature not lower than the lower limit of temperature; and
    subjecting each substrate having the second state to a heat process at a temperature not lower than the lower limit of temperature, without holding the substrate having the second state at a temperature lower than the lower limit of temperature.

2. The substrate processing method according to claim 1, wherein the coating film is an anti-reflective coating or resist film.

3. The substrate processing method according to claim 1, wherein said holding the substrate at the preparatory temperature is arranged to localize the predetermined component.

4. The substrate processing method according to claim 1, wherein the temperature not lower than the lower limit of temperature is a temperature for hardening or cross-linking the coating film.

5. The substrate processing method according to claim 1, wherein the preparatory temperature is within a range of 70 to 100° C.

6. A computer readable storage medium containing a control program for execution on a computer, which, when executed, causes the computer to control a substrate processing apparatus to conduct a substrate processing method for performing a heat process on a plurality of substrates each with a coating film formed thereon to bake and cure the coating film, while sequentially transferring the substrates, the method comprising:
    distinguishing the substrates from each other in accordance with a first state and a second state where an elapsed time length since formation of the coating film is shorter and not shorter, respectively, than a predetermined time length;
    holding each substrate having the first state at a preparatory temperature lower than a lower limit of temperature for baking and curing the coating film, to adjust distribution of a predetermined component in the coating film, and then subjecting the substrate having the first state to a heat process at a temperature not lower than the lower limit of temperature; and
    subjecting each substrate having the second state to a heat process at a temperature not lower than the lower limit of temperature, without holding the substrate having the second state at a temperature lower than the lower limit of temperature.

* * * * *